(12) United States Patent
Yokoi

(10) Patent No.: US 8,449,101 B2
(45) Date of Patent: May 28, 2013

(54) INK COMPOSITION AND METHOD OF PRODUCING A PROCESSED PRODUCT OF PRINTED MATTER

(75) Inventor: Kazuhiro Yokoi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 262 days.

(21) Appl. No.: 12/882,221

(22) Filed: Sep. 15, 2010

(65) Prior Publication Data

US 2011/0074896 A1 Mar. 31, 2011

(30) Foreign Application Priority Data

Sep. 28, 2009 (JP) ................. 2009-222803

(51) Int. Cl.
  *B41J 2/01* (2006.01)
  *G03G 9/097* (2006.01)
(52) U.S. Cl.
  USPC .......................................... 347/102; 522/75
(58) Field of Classification Search
  None
  See application file for complete search history.

(56) References Cited

U.S. PATENT DOCUMENTS

| 3,932,346 A | 1/1976 | Pasternack et al. |
| 5,260,167 A * | 11/1993 | Sasa et al. .................. 430/272.1 |
| 7,059,710 B2 * | 6/2006 | Ishikawa ......................... 347/68 |
| 2007/0254246 A1 * | 11/2007 | Oikawa ......................... 430/434 |
| 2008/0192100 A1 * | 8/2008 | Nakajima ..................... 347/102 |

FOREIGN PATENT DOCUMENTS

| EP | 0387087 A | 9/1990 |
| EP | 1983017 A | 10/2008 |
| GB | 2141131 A | 12/1984 |
| JP | 56-75643 A | 6/1981 |
| JP | 2002-167537 A | 6/2002 |
| JP | 2004-149755 A | 5/2004 |
| JP | 2006-160824 A | 6/2006 |

* cited by examiner

*Primary Examiner* — Stephen Meier
*Assistant Examiner* — Alexander C Witkowski
(74) *Attorney, Agent, or Firm* — SOLARIS Intellectual Property Group, PLLC

(57) ABSTRACT

An active radiation curable ink composition is disclosed. The ink composition includes a compound having a persulfide bond, at least one end of the persulfide bond being bonded to a ring structure directly or via a carbonyl group or a thiocarbonyl group; one or more radical polymerizable compounds; and a photopolymerization initiator.

9 Claims, No Drawings

INK COMPOSITION AND METHOD OF PRODUCING A PROCESSED PRODUCT OF PRINTED MATTER

CROSS-REFERENCE TO RELATED APPLICATION

This Application claims priority under 35 USC 119 from Japanese Patent Application No. 2009-222803 filed on Sep. 28, 2009, the disclosure of which is incorporated by reference herein.

BACKGROUND OF THE INVENTION

1. Technical Field

The present invention relates to an ink composition and a method of producing a processed product of printed matter.

2. Description of the Related Art

Various methods such as electrophotographic methods, sublimation-type thermal transfer methods, fusion-type thermal transfer methods, and inkjet methods are known as image recording methods in which images are formed on recording media, such as paper, according to image data signals. For example, an inkjet method is an excellent image recording method because it can be carried out using inexpensive apparatus, it enables efficient use of ink and lower running costs since an image is directly formed on a recording medium by ejecting ink droplets only onto the region in which the image is to be formed, and it is less noisy.

The inkjet method enables printing not only on plain paper, but also non-water-absorbing recording media such as plastic sheets and metal plates. However, high speed printing and high quality images have been issues needed to be addressed, and the time periods required for drying and curing the ink droplets printed by the inkjet method significantly affect, for example, the productivity of printed matter, the sharpness of a printed image, and the like.

In one inkjet method, an inkjet recording ink which can be cured by irradiation with radiation is used. In this method, ink droplets are cured by irradiation with radiation immediately after ink ejection or after a certain period of time has passed after ink ejection, whereby the productivity of printing is improved and sharp images are formed.

By increasing radiation sensitivity of the inkjet recording ink which can be cured by irradiation with radiation such as ultraviolet rays, a high curing property against the radiation is imparted to the ink, leading to various advantages such as improvement in productivity of inkjet recording, reduction in electrical consumption, longer life time of a radiation generator due to load reduction thereto, and prevention of evaporation of low-molecular-weight substances which may be caused by insufficient curing. In particular, by increasing the radiation sensitivity of the ink, the strength of an image formed from the inkjet recording ink is increased.

It is preferable that an image formed from an ink have flexibility and adhesiveness with a base material. In particular, the flexibility of an image is an important factor when the image is formed on a surface of a non-flat base material or on a surface of a flexible base material such as a resin film, or when a shaped product of printed matter, such as a resin-made bottle, is produced by forming a printed matter in which the image is printed thereon into a shaped product. However, it has been difficult to achieve a favorable balance between the curing property and the flexibility. Specifically, when a proportion of a monofunctional monomer is increased to improve flexibility, the curing property tends to decrease, or the image surface tends to be sticky owing to leaking of uncured low-molecular-weight components.

In order to improve adhesiveness, flexibility, and curing property, a technique in which a low-viscosity urethane acrylate is used in an inkjet ink composition has been suggested (see, for example, Japanese Patent Application Laid-Open (JP-A) No. 2002-167537). However, even when this ink composition is used, it is difficult to attain a satisfactory curing property when a content of a monofunctional monomer is increased to produce a more flexible ink film.

In order to obtain a photopolymerization initiator composition which is cured at high sensitivity and has excellent storage stability, a technique is known in which a polyfunctional thiol compound having a specific structure is used as a component of a photopolymerization initiator composition for a photosensitive composition (see, for example, JP-A No. 2004-149755, or EP 1983017). However, by the technique disclosed in JP-A No. 2004-149755, it is difficult to completely prevent the blocking due to leaching of a slight amount of uncured components, such as degradation residues of a polymerization initiator and a solvent.

JP-A No. 56-75643 discloses that polymerization inhibition caused by oxygen can be reduced by adding a specific disulfide.

JP-A No. 2006-160824 discloses that an ink composition having a favorable curing property can be obtained by using a polymerizable compound having a specific structure having a polymerizable group and a disulfide bond.

SUMMARY OF THE INVENTION

According to an aspect of the present invention, an active radiation curable ink composition is provided. The active radiation curable ink includes a compound having a persulfide bond, at least one end of the persulfide bond being bonded to a ring structure directly or via a carbonyl group or a thiocarbonyl group; one or more radical polymerizable compounds; and a photopolymerization initiator.

According to another aspect of the present invention, a method of producing a processed product of printed matter is provided. The method includes: ejecting the active radiation curable ink composition according to an aspect of the present invention by an inkjet method onto a recording medium formed from a formable resin material to form an image; irradiating the obtained image with active radiation to cure the ink composition, thereby obtaining a printed matter having a cured image on the recording medium; and subjecting the printed matter to at least one processing selected from the group consisting of forming processing and punching processing.

DETAILED DESCRIPTION OF THE INVENTION

However, in a conventional ink, a favorable balance between the sensitivity and the flexibility of a cured ink, which is necessary for processing a printed matter, has yet to be achieved, and transferring of the ink of a printed matter to a back surface of another printed matter stacked thereon, evaporation of the uncured components remaining in the cured film during storage, and the like, have yet to be addressed.

The ink composition of the invention includes a compound having a persulfide bond, a radical polymerizable compound, and a photopolymerization initiator.

When a volatile component derived from an ink composition components is left in a processed product or printed matter on which an image has been printed using the ink composition, not only the processed product or printed matter may suffer from adverse effects (such as dissolution and bleeding), but vacuum-formed products enclosing the processed product or printed matter may be adversely affected. For example, volatile components may evaporate from the printed matter, and may adhere to the inner surface of an airtight container. More specifically, if volatile components are left in a shaped product of printed matter on which numerals of an indicator are printed when an instrument panel of an automobile is produce, the protective glass for the instrument panel may mist, leading to difficulty in reading out the indicator. Moreover, a dummy can, which is used for display of PET bottles for drinking water, is produced by printing of the product name, components, and the like of the drinking water and subsequent vacuum forming; however, when the dummy can is stored in an automatic vending machine, volatile components evaporating from the dummy can may mist the display part of the vending machine.

In the ink composition of the invention, a specific compound having a persulfide bond is used, whereby polymerization inhibition caused by oxygen can be reduced, polymerization reaction of a polymerizable compound can be promoted, crosslinking reaction can be efficiently promoted, and the ink composition can be rapidly cured to form a strong film. Since the film prevents the leaking of uncured low-molecular-weight components remaining in the ink to the surface of an image, excellent anti-blocking property can be imparted to the ink image surface.

Furthermore, when the proportion of a monofunctional monomer in the polymerizable compound contained in the ink composition is increased, flexibility and stretch property may be improved.

Accordingly, a film having excellent flexibility at high sensitivity may be formed, using the ink composition according to the invention.

Furthermore, since a specific compound having a persulfide bond is used in the ink composition, the compound itself may have less odor. Further, the polymerization reaction of a polymerizable compound may be promoted as described above, and the ink composition can be cured at high sensitivity, as compared with a case in which a thiol compound, which is a typical known chain transfer agent, is used, whereby the monomers remaining unreated can be reduced, and odor of the curable composition can be reduced.

According to the invention, an ink composition which can be cured at high sensitivity and has excellent flexibility may be obtained, and an ink composition preferably used for inkjet recording may be obtained in which the remaining volatile components are reduced, and odor is reduced. As a result, a process of removing the volatile components can be omitted when printing is carried out using the ink composition, and a printed matter having excellent processability can be obtained.

As described above, the printed matter obtained using the ink composition has excellent processability; therefore, a printed matter obtained by printing an image on a support (recording medium) formed from a resin or the like using the ink, may be preferably used for production of a processed product of printed matter formed by forming processing such as vacuum processing, such as advertising media having a three-dimensional structure and dummy cans.

Hereinafter, the ink composition of the invention is described in detail.

[Ink Composition]

The ink composition of the invention includes: a compound having a persulfide bond, at least one end of the persulfide bond being bonded to a ring structure directly or via a carbonyl group or a thiocarbonyl group (may also be referred to as a specific compound having a persulfide bond); a radical polymerizable compound; and a photopolymerization initiator.

<Compound Having Persulfide Bond, at Least One End of Persulfide Bond Being Bonded to Ring Structure Directly or Via Carbonyl Group or Thiocarbonyl Group>

The specific compound having a persulfide bond to be used in the invention is not particularly limited with respect to the number of persulfide bond in a molecule thereof. The compound may have plural persulfide bonds in a molecule thereof.

Especially from the viewpoints of preventing leaching and maintaining of high sensitivity, the specific compound having a persulfide bond has preferably at least two persulfide bonds in a molecule thereof, more preferably at least 4 persulfide bonds in a molecule thereof, and still more preferably at least 6 persulfide bonds in a molecule thereof.

The specific compound having a persulfide bond is a compound in which at least one end of the persulfide bond is bonded to a ring structure directly or via a carbonyl group or a thiocarbonyl group. The ring structure may be, for example, an aromatic ring group which may have a substituent and may include a hetero atom.

The specific compound having a persulfide bond in the invention may be commercially available. Examples thereof include 4,4'-diaminodiphenyl disulfide (DTDA, trade name, manufactured by Sumitomo Seika Chemicals Co., Ltd.). Hereinbelow, a compound having a persulfide bond may be referred to as "disulfide compound".

Alternatively, the specific compound having a persulfide bond may be synthesized by a known method using a corresponding thiol compound. A disulfide compound having an asymmetric structure may be synthesized by a method disclosed in Synthesis 2008, No. 16, pp 2491-2509.

The compound having a persulfide bond, at least one end of the persulfide bond being bonded to a ring structure directly or via a carbonyl group or a thiocarbonyl group, is preferably a compound represented by the following Formula (I) or a compound represented by the following Formula (II).

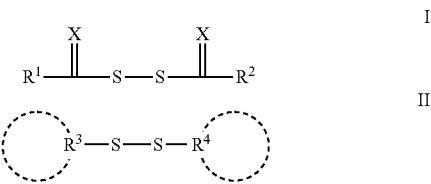

In Formula (I), each X independently represents an oxygen atom or a sulfur atom; $R^1$ and $R^2$ each independently represents a straight-chain, branched or cyclic alkyl group having 1 to 20 carbon atoms which may have a substituent and may include a hetero atom, or an aromatic ring group which may have a substituent and may include a hetero atom; and at least one of $R^1$ and $R^2$ represents a ring structure.

In Formula (II), $R^3$ and $R^4$ each independently represents an aromatic ring group which may have a substituent and may include a hetero atom. When the aromatic ring group has plural substituents, the substituents may be bonded with each other to form a three-membered or higher-membered ring structure.

In Formula (I), X preferably represents an oxygen atom.

The straight-chain, branched or cyclic alkyl group having 1 to 20 carbon atoms which is represented by $R^1$ or $R^2$ is preferably a straight-chain, branched or cyclic alkyl group having 3 to 12 carbon atoms, and more preferably a straight-chain, branched or cyclic alkyl group having 3 to 8 carbon atoms.

The alkyl group represented by $R^1$ or $R^2$ may have a substituent. Examples of the substituent that may be introduced include a halogen atom, a hydroxyl group, a cyano group, a nitro group, an amino group, an amide group, an ester group, a thioester group, an ether group, alkyl group, an alkyleneoxy group, a phenyl group, a naphthyl group, and a radical polymerizable group such as an acryl group or a methacryl group, and a combination of at least two of them may be used. However, at least one of $R^1$ and $R^2$ represents a ring structure.

Examples of the hetero atom which may be included in the aromatic ring group which is represented by $R^1$ or $R^2$ and may include a hetero atom include an oxygen atom, a sulfur atom, and a nitrogen atom, and an oxygen atom or a nitrogen atom is preferable, and a nitrogen atom is more preferable.

The aromatic ring group preferably has 1 to 4 aromatic rings, and more preferably has 1 or 2 aromatic rings. The aromatic ring of the aromatic ring group is preferably a 5-membered to 20-membered aromatic ring, and more preferably a 5-membered to 12-membered ring. The aromatic ring may be a monocycle or a condensed ring.

In an example of a preferable combination of the substituents in Formula (I), $R^1$ represented a phenyl group, a pyridine group, a piperidine group, a furan group, a thiophene group, or an imidazole group; $R^2$ represents a substituted phenyl group, a pyridine group, a piperidine group, a furan group, a thiophene group, or an imidazole group; and X represents a sulfur atom. The compound represented by Formula (I) preferably has at least one aromatic or hetero aromatic ring in a molecule thereof, and more preferably has at least two rings selected from aromatic rings and hetero aromatic rings, in a molecule thereof. The substituent at the aromatic ring is preferably an electron-donating group such as an amino group, a hydroxyl group, or an alkyloxy group.

In Formula (II), the aromatic ring group represented by $R^3$ or $R^4$ preferably has preferably 1 to 4 aromatic rings, and more preferably 1 to 2 aromatic rings. The aromatic ring is preferably a 5-membered to 20-membered ring, and more preferably a 5-membered to 12-membered ring. The aromatic ring may be a monocycle or a condensed ring.

Examples of the hetero atom of the hetero cyclic group represented by $R^3$ or $R^4$ include an oxygen atom, a sulfur atom, and a nitrogen atom, and an oxygen atom or a nitrogen atom is preferable, and a nitrogen atom is more preferable.

Examples of the substituent which may be introduced to $R^3$ or $R^4$ include a halogen atom, a hydroxyl group, a cyano group, a nitro group, an amino group, an amide group, an ester group, a thioester group, an ether group, an alkyl group, an alkyleneoxy group, a phenyl group, a naphthyl group, and a radical polymerizable group such as an acryl group or a methacryl group, and a combination of at least two of them may be used.

In an example of a preferable combination of the substituents in Formula (II), $R^3$ represents a group derived from benzene, pyridine, oxazoline, benzoxazole, or benzothiazole, which may have a substituent; $R^4$ represents a group derived from benzene, pyridine, oxazoline, benzoxazole, or benzothiazole, which may have a substituent.

In other preferable embodiments of the invention, the compound having a persulfide bond, at least one end of the persulfide bond being bonded to a ring structure directly or via a carbonyl group or a thiocarbonyl group, may be a polymer compound which has a weight-average molecular weight of from 3,000 to 100,000 and which has, in a side chain thereof, a partial structure represented by the following Formula (III) or Formula (IV).

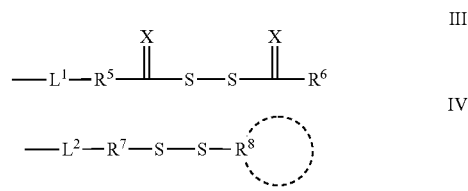

In Formula (III), $L^1$ represents a divalent linking group; $R^5$ represents a straight-chain, branched or cyclic alkylene group having 1 to 20 carbon atoms which may have a substituent and may include a hetero atom, or an aromatic ring group which may have a substituent and may include a hetero atom; $R^6$ represents a straight-chain, branched or cyclic alkyl group having 1 to 20 carbon atoms which may have a substituent and may include a hetero atom, or an aromatic ring group which may have a substituent and may include a hetero atom; and at least one of $R^5$ and $R^6$ represents a ring structure.

In Formula (IV), $L^2$ represents a divalent linking group; $R^7$ represents a straight-chain, branched or cyclic alkylene group having a carbon 1 to 20 carbon atoms which may have a substituent and may include a hetero atom, or an aromatic ring group which may have a substituent and may include a hetero atom; $R^8$ represents an aromatic ring group which may have a substituent and may include a hetero atom. When the aromatic ring group has plural substituents, the substituents may be bonded with each other to form a 3-membered or higher-membered cyclic structure.

Examples of the substituents which may be introduced to $R^5$ to $R^8$, respectively, include those described as the examples of the substituents which may be introduced to the alkyl group represented by $R^1$ or $R^2$ of Formula (I) or (II).

Examples of the divalent linking group represented by $L^1$ or $L^2$ include an alkylene group having 1 to 20 carbon atoms which may have a substituent and may include a hetero atom, and an alkyleneoxy group having 2 to 12 carbon atoms which may have a substituent and may include a hetero atom, and more preferable examples thereof include an amide group, an ester group, a urea group, a thioester group, a urethane group, a benzene ring, an alkylene group including those listed above, and an alkyleneoxy group including those listed above.

$R^5$ and $R^7$ each independently preferably represent a divalent group derived from benzene, pyridine, piperidine, furan, thiophene, or imidazole, which may have a substituent, and more preferably a divalent group derived from benzene or pyridine, which may have a substituent.

$R^6$ and $R^8$ have the same definitions as those of $R^1$ and $R^3$ of Formulae (I) and (II), respectively, and preferable scopes thereof are the same, respectively.

In an example of a preferable combination of the substituents of Formula (III), $L^1$ represents an alkylene group, an aralkylene group, an alkyleneoxy group, an amide group, an ester group, or a phenylene group; $R^5$ represents a phenylene group, a pyridinediyl group, a piperidinediyl group, a furandiyl group, a thiophenediyl group, or an imidazoldiyl group, which may have a substituent; $R^6$ represents a phenyl group, a pyridinyl group, a piperidinyl group, a piperazinyl group, a furanyl group, a thiophenyl group, an imidazolyl group, a morpholinyl group, or a pyridazinyl group, which may have a substituent; and X represent an oxygen atom.

In an example of a preferable combination of the substituents of Formula (IV), $L^2$ represents an alkylene group, an aralkylene group, an alkyleneoxy group, an amide group, an ester group, or a phenylene group; $R^7$ and $R^8$ each independently represents a phenyl or phenylene group, a pyridinyl or pyridindiyl group, a piperidinyl or piperidinediyl group, a furanyl or furandiyl group, a thiophenyl or thiophennediyl group, or an imidazolyl or imidazolediyl group, which may have a substituent, and at least one of $R^7$ and $R^8$ preferably represents a phenyl or phenylene group or a pyridinyl or pyridindiyl group, which may have a substituent.

The content of the partial structure represented by Formula (III) or (IV) in a polymer compound may be from 1 to 80% by weight, preferably from 3 to 70% by weight, and more preferably from 5 to 60% by weight.

A main chain skeleton of a polymer compound having, at a side chain thereof, a partial structure represented by Formula (III) or (IV) may be: (A) a main chain skeleton formed from a usual ethylenic polymerization unit, such as a (meth)acrylate or a (meth)acrylamide; (B) a polymer of which main chain is formed by polycondensation or addition polymerization, such as a polyester, a polyurethane, or a polyurea; (C) a polymer compound having a functional group which can be modified by a polymer reaction, such as polysiloxane, a polyethylene imine, or a polyvinyl alcohol.

Specifically, the polymer compound having, at a side chain thereof, a partial structure represented by Formula (III) or (IV) is a compound including, as a copolymerization unit, a unit having, at a side chain thereof, a partial structure represented by Formula (III) or (IV). Examples of other copolymerization units include: as the above (A), a unit derived from a monomer having an ethylenic unsaturated double bond; as the (B) above, a unit derived from a bifunctional compound such as a dicarboxylic acid, a diamine, a diol, or a diisocyanate; and as the above (C), a unit derived from a compound that can modify a functional group of the main chain, but not limited thereto, such as a unit derived from an aldehyde or a halogenated compound. In particular, from the viewpoint of synthesis, other copolymerization components may be preferably the above (A) or (B).

The polymer compound having, at a side chain thereof, a partial structure represented by Formula (III) or (IV) may have a weight-average molecular weight of from 3,000 to 100,000, preferably from 3,000 to 80,000, and more preferably from 5,000 to 50,000. When the weight-average molecular weight is within the above ranges, both the ejection stability and high sensitivity may be attained.

Hereinafter, specific examples of the compound represented by Formula (I) or (II) and the polymer compound having, at a side chain thereof, a partial structure represented by Formula (III) or (IV) are shown. However, the invention is not limited to those.

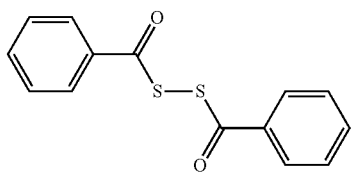

a-1

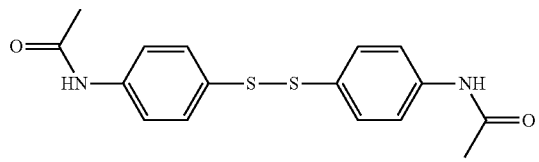

a-2

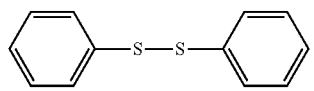

a-3

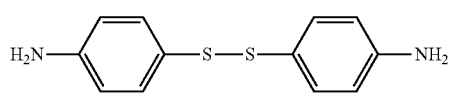

a-4

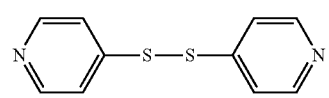

a-5

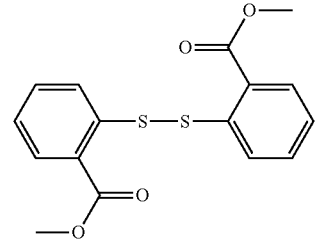

a-6

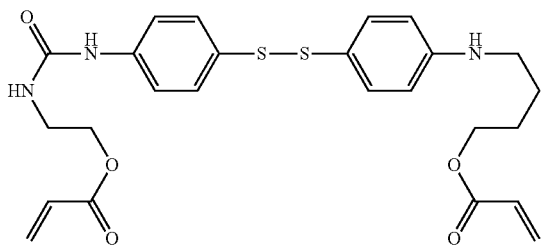

a-7

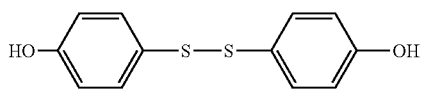

a-8

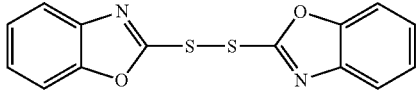

a-9

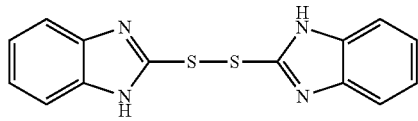

a-10

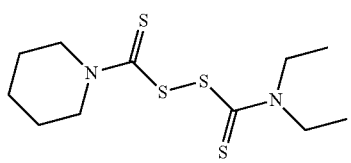

a-11 a-12
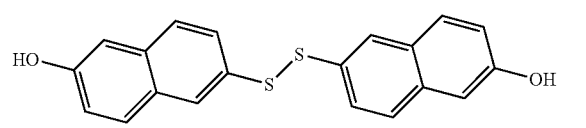
a-13
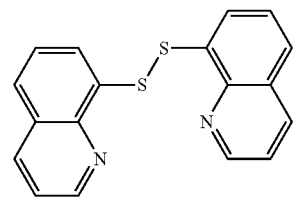
a-14
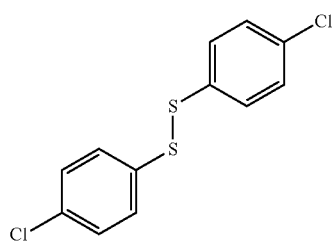
a-15
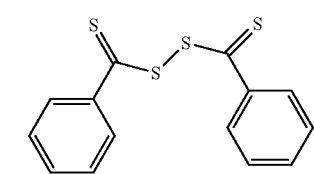
a-16
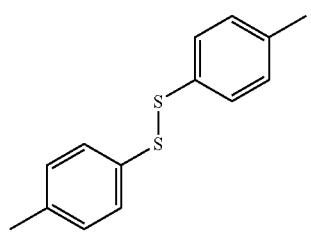
a-17
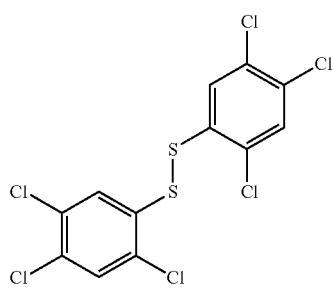
a-18
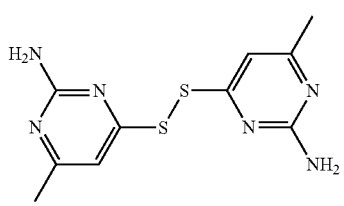
a-19
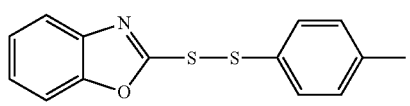
a-20
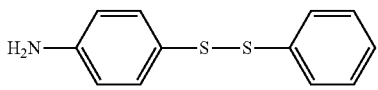
a-21
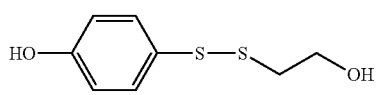
a-22
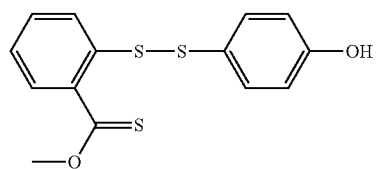
a-23
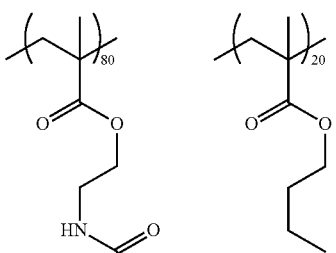
Mw = 16000
a-24
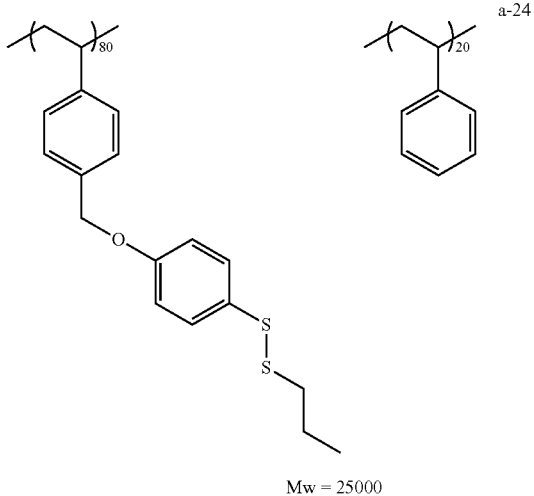
Mw = 25000

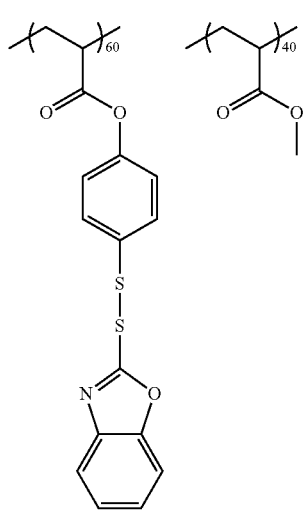

a-25

Mw = 12000

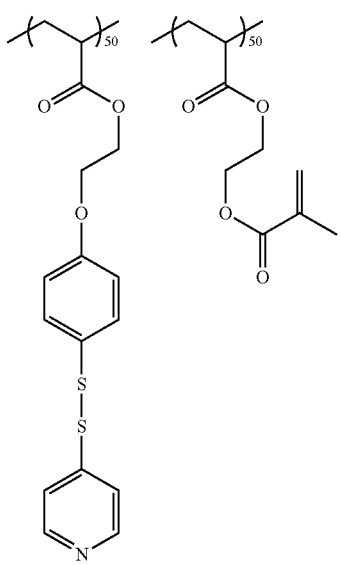

a-26

Mw = 8000

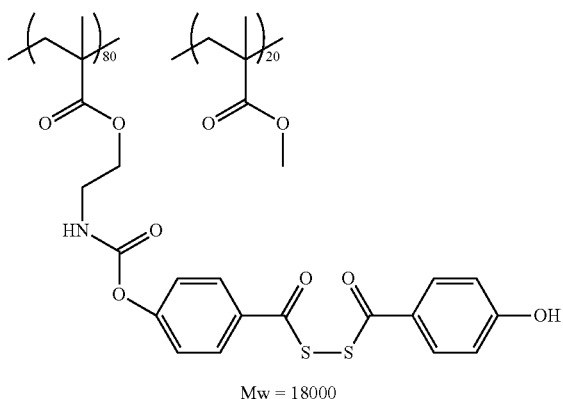

a-27

Mw = 18000

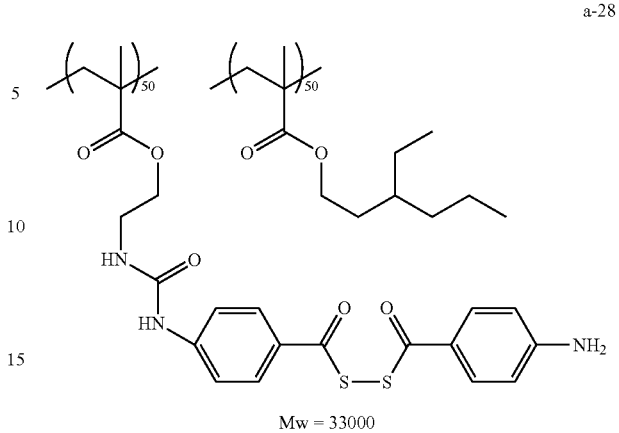

a-28

Mw = 33000

In another preferable embodiment of the invention, the compound having a persulfide bond and ring structures, at least one end of the persulfide bond being bonded to a ring structure directly or via a carbonyl group or a thiocarbonyl group is a polymer compound which has, at the main chain thereof, a partial structure represented by the following Formula (V) or (VI) and has a weight-average molecular weight of from 3,000 to 100,000.

More preferably, the specific compound having a persulfide bond is a polymer compound which includes the partial structure as a structural unit, and the main chain of the polymer is formed by containing the structural unit as a copolymerization component.

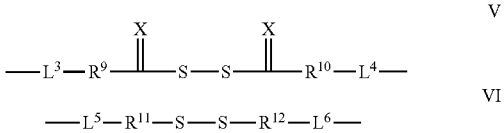

In Formula (V), $L^3$ and $L^4$ each independently represents a divalent linking group; $R^9$ and $R^{10}$ each independently represents a divalent aromatic ring group which may include a hetero atom and may have a substituent or an alicyclic alkylene group which may include a hetero atom and may have a substituent.

In Formula (VI), $L^5$ and $L^6$ each independently represents a divalent linking group; $R^{11}$ and $R^{12}$ each independently represents a divalent aromatic ring group which may include a hetero atom and may have a substituent, or an alicyclic alkylene group which may include a hetero atom and may have a substituent.

The divalent linking group represented by each of $L^3$ to $L^6$ has the same definition as that of $L^1$ of Formula (III), and preferable scope thereof is also the same.

$R^9$ and $R^{10}$ are preferably the same as each other, and $R^9$ and $R^{10}$ both more preferably represent an aromatic ring, and still more preferably represent a benzene ring having an electron-donating group.

Preferable embodiments of the $R^{11}$ and $R^{12}$ are the same as those of $R^9$ and $R^{10}$.

In an example of a preferable combination of the substituents of Formula (V), $L^3$ and $L^4$ each independently represents an amide group, an ester group, a urea group, a thioester group, a urethane group, an alkylene group including those described above, an alkyleneoxy group including those described above, or a single bond; $R^9$ and $R^{10}$ preferably have the same structure, and preferably each represent a phenylene group, a pyridinediyl group, a piperidinediyl group, a furandiyl group, a thiophenediyl group, or an imidazolediyl group, which may have a substituent; and X represents an oxygen atom.

In a preferable combination of the substituents of Formula (VI), $L^5$ and $L^6$ each represent an amide group, an ester group, a urea group, a thioester group, a urethane group, an alkyl group including those described above, an alkyleneoxy group including those described above, or a single bond; and $R^{11}$ and $R^{12}$ preferably have the same structure, and represent a phenylene group, a pyridinediyl group, a piperidinediyl group, a furandiyl group, a thiophenediyl group, or an imidazolediyl group, which may have a substituent.

The content of the partial structure represented by Formula (V) or (VI) in a polymer compound is from 1 to 50% by weight, more preferably from 3 to 50% by weight, and more preferably from 5 to 50% by weight.

The polymer compound having, as a main chain thereof, the partial structure represented by Formula (V) or (VI) is a compound including, as a copolymerization component, a unit having, as a main chain thereof, a partial structure represented by Formula (V) or (VI), and examples of other copolymerization components include a polyalkylene oxide.

The polymer compound having, as a main chain thereof, the partial structure represented by Formula (V) or (VI) may have a weight-average molecular weight of from 3,000 to 100,000, more preferably from 3,000 to 80,000, and still more preferably from 5,000 to 50,000. When the weight-average molecular weight is within the above ranges, both the ejection stability and high sensitivity are attained.

Hereinafter, specific examples of the polymer compound having, as a main chain thereof, a partial structure represented by Formula (V) or (VI) are shown. However, the invention is not limited to those.

a-29

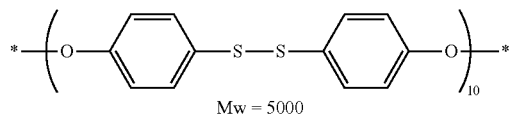

Mw = 5000 a-30

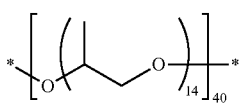

Mw = 2500 a-31

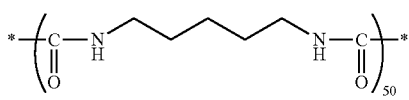

Mw = 110000 a-32

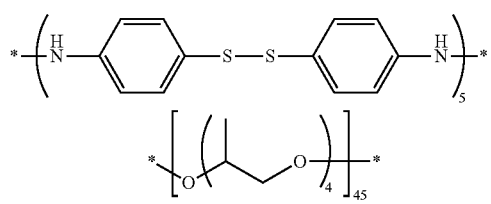

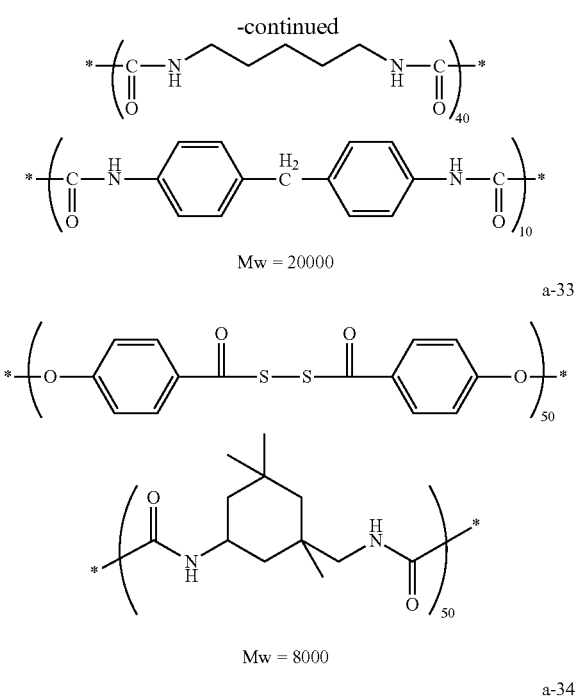

Mw = 20000 a-33

Mw = 8000 a-34

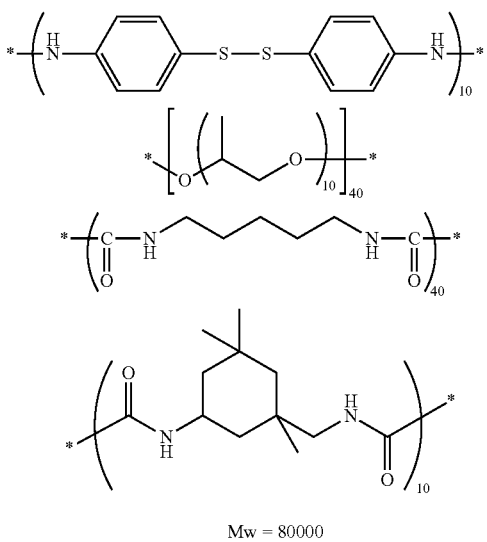

Mw = 80000

Of the specific examples, preferable compounds and polymer compounds are a-2, a-3, a-4, a-8, a-9, a-16, a-23, a-29, a-32, and a-34.

From the viewpoint of inhibiting outgassing, the specific compound having a persulfide bond, which is used in the ink composition of the invention, preferably has a molecular weight of 500 or more.

From the viewpoints of ejection stability and reduction in odor, the ink composition preferably contains a polymer compound which has a persulfide bond and is represented by any one of Formulae (III) to (VI).

As described above, examples of the polymer compound having a persulfide bond include a compound which has a persulfide bond at a side chain thereof and which is represented by Formula (III) or (IV) and a compound which has a persulfide bond at a main chain thereof and which is represented by Formula (V) or (VI), and both of them may be preferably used. However, from the viewpoint of synthesis, it is preferable to used a polymer compound having a persulfide bond at a main chain thereof (i.e., a polymer compound represented by Formula (V) or (VI)).

The amount of the specific compound having a persulfide bond to be added is preferably from 0.1 to 20%, more preferably from 0.5 to 10%, and still more preferably from 1 to 5%, with respect to the total mass of the ink composition, from the viewpoints of improving sensitivity and stretch property.

<Radical Polymerizable Compound>

The ink composition of the invention further includes a radical polymerizable compound. The type of the radical polymerizable compound is not particularly limited.

The radical polymerizable compound to be used in the invention is a compound having at least one radical-polymerizable ethylenic unsaturated bond in a molecule thereof, and may be a monomer, an oligomer, a polymer, or the like.

Only one species of a radical polymerizable compound may be used, or a combination of two or more species thereof may be used in an arbitrary ratio depending on the intended property to be improved. It is preferable to use a combination of two or more species thereof from the viewpoint of controlling properties and performances, such as reactivity and physical property.

Examples of the polymerizable compound having a radical-polymerizable ethylenic unsaturated bond include: unsaturated carboxylic acids such as acrylic acid, methacrylic acid, itaconic acid, crotonic acid, isocrotonic acid, or maleic acid, and salts thereof; anhydrides having an ethylenic unsaturated bond; acrylonitrile; styrene; and radical-polymerizable compounds such as various unsaturated polyesters, unsaturated polyethers, unsaturated polyamides, and unsaturated urethanes.

Specifically, radical-polymerizable or crosslinkable monomers, oligomers, and polymers which are commercially available or known in the technical field, such as those disclosed in Shinzo Yamashita, "Kakyozai Handbook", Taiseisha Ltd., 1981; Kiyomi Kato, "UV/EB Kohka Handbook (Zairyo-hen)", Kobunshi Kankokai, 1985; RadTech Japan, "UV/EB Kohka Gijutsu no Ouyou to Shijou", p. 79, CMC Publishing Co., Ltd., 1989; or Eiichiro Takiyama, "Polyester Resin Handbook", The Nikkan Kogyo Shinbun Ltd., 1988.

Moreover, photopolymerizable compound materials used for photopolymerizable compositions disclosed in, for example, JP-A No. 7-159983, Japanese Patent Application Publication No. 7-31399, JP-A No. 8-224982, JP-A No. 10-863, and JP-A 9-134011 are known as radical polymerizable compounds, and any of these may be used in the ink composition of the invention.

It may be preferable to use a vinyl ether compound as the radical polymerizable compound. Examples of vinyl ether compounds preferably used include: divinyl ether compounds and trivinyl ether compounds, such as ethylene glycol divinyl ether, ethylene glycol monovinyl ether, diethylene glycol divinyl ether, triethylene glycol monovinyl ether, triethylene glycol divinyl ether, propylene glycol divinyl ether, dipropylene glycol divinyl ether, butane diol divinyl ether, hexane diol divinyl ether, cyclohexane dimethanol divinyl ether, hydroxyethyl monovinyl ether, hydroxynonyl monovinyl ether, and trimethylol propane trivinyl ether; and monovinyl ether compounds such as ethyl vinyl ether, n-butyl vinyl ether, isobutyl vinyl ether, octadecyl vinyl ether, cyclohexyl vinyl ether, hydroxybutyl vinyl ether, 2-ethylhexyl vinyl ether, cyclohexane dimethanol monovinyl ether, n-propyl vinyl ether, isopropyl vinyl ether, ispropenyl ether-O-propylene carbonate, dodecyl vinyl ether, diethylene glycol monovinyl ether, and octadecyl vinyl ether.

Of these vinyl ether compounds, divinyl ether compounds and trivinyl ether compounds are preferable, and divinyl ether compounds are particularly preferable, from the viewpoints of curing property, adhesiveness, and surface hardness. Only one species of the vinyl ether compounds may be used, or a combination of two or more thereof may be used.

In the radical polymerizable compound to be used in the ink composition, the content of the monofunctional monomer is preferably from 85 to 100% by mass, and more preferably from 90 to 100% by mass, with respect to the total mass of the polymerizable compound, from the viewpoints of improving stretch property and flexibility of the ink composition.

The monofunctional monomer is a compound having one radical-polymerizable ethylenic unsaturated bond in a molecule thereof.

As the monofunctional monomer, a monomer disclosed in "Hikari Kohka Gijutsu Databook Zairyo-hen", Kunihiro Ichimura, Kiyomi Kato, Technonet, may preferably used.

From the viewpoint of improving the adhesiveness between the ink composition and a base material when an image is printed on a recording medium (i.e., base material) made of polycarbonate (PC) or the like, it is preferable that the monofunctional monomer include at least one selected from an amine group-containing monomer, N-vinyl caprolactam (NVC), tetrahydrofurfuryl acrylate (THFA), isobornyl acrylate (IBOA), and phenoxyethyl acrylate (PEA).

The amine group-containing monomer is preferably a monomer containing a tertiary amine from the viewpoints of dispersion stability and the like, and specific examples thereof include 1,2,2,6,6-pentamethyl piperidyl acrylate, dimethyl amino ethyl acrylate, and diethyl amino propyl acrylate.

It is more preferable that the monofunctional monomer be at least one selected from an amine group-containing monomer, NVC, THFA, IBOA, and phenoxyethyl acrylate (PEA).

The amount of the radical polymerizable compound is preferably from 50 to 90% by mass, more preferably from 55 to 90% by mass, and still more preferably from 60 to 85% by mass, with respect to the total solid contents in the ink composition of the invention. When the amount of the radical polymerizable compound is within the above ranges, a film having excellent curing property and color reproducibility can be obtained.

<Photopolymerization Initiator>

The ink composition of the invention further includes a photopolymerization initiator.

It is preferable that the ink composition include a polymerization initiator (which may be appropriately referred to as "specific polymerization initiator") selected from the group consisting of α-aminoketones and acyl phosphine oxides which are described hereinbelow. The specific polymerization initiator may be used with any one of other known polymerization initiators in combination.

Examples of the polymerization initiator selected from the group consisting of α-aminoketones and acyl phosphine oxides include polymerization initiators disclosed in paragraphs [0057] to [0085] of JP-A No. 2008-195926.

The amount of the specific polymerization initiator in the ink composition is preferably from 0.1 to 30% by mass, and more preferably from 0.2 to 20% by mass in terms of solid content.

<Other Polymerization Initiators>

The ink composition of the invention may include, as a photopolymerization initiator, an additional photopolymerization initiator other than the specific polymerization initiator, in combination with the specific polymerization initiator.

Any one of known compounds may be used as the additional photopolymerization initiator. Examples of additional photopolymerization initiator preferably used in the invention include: (A) aromatic ketones; (B) acyl phosphine oxide compounds; (C) aromatic onium salt compounds; (D) organic peroxides; (E) thio compounds; (F) hexaaryl biimidazole compounds; (G) ketooxime ester compounds; (H) borate compounds; (I) azinium compounds; (J) metallocene compounds; (K) active ester compounds; (L) compounds having a carbon-halogen bond; and (M) alkylamine compounds.

Only one species of other photopolymerization initiators may be used, or a combination of two or more of them may be used. From the viewpoint of effects, it is preferable to use a combination of two or more species of other photopolymerization initiators.

Specific examples of other photopolymerization initiators to be used in the invention include benzoin isobutyl ether, 2,4-diethylthioxanthone, 2-isopropylthioxanthone, benzyl, 2,4,6-trimethylbenzoyl diphenyl phosphine oxide, 2-benzyl-2-dimetylamino-1-(4-morpholinophenyl)-butan-1-one, bis(2,4,6-dimethoxybenzoyl)-2,4,4-trimethylpentyl phosphine oxide, 1,2-octanedione, and 1-(4-(phenylthio)-2,2-(O-benzoyloxime)). Furthermore, any one of other molecule cleavage initiators such as 1-hydroxycyclohexyl phenyl ketone, benzoin ethyl ether, benzyldimethyl ketal, 2-hydroxy-2-methyl-1-phenylpropan-1-one, 1-(4-isopropylphenyl)-2-hydroxy-2-methylpropan-1-one, and 2-methyl-1-(4-methylthiophenyl)-2-morpholinopropan-1-one may be used in combination with the other photopolymerization initiator. Furthermore, a hydrogen-abstraction photoinitiator such as isophthal phenone or 4-benzoyl-4'-methyl-diphenylsulfide may be used in combination.

The amount of the photopolymerization initiator in the ink composition is preferably from 0.01 to 35 parts by mass, more preferably from 0.1 to 30 parts by mass, and still more preferably from 0.5 to 30 parts by mass, with respect to 100 parts by mass of the total amount of the polymerization compound.

As used herein, the amount of the photopolymerization initiator means a total amount of photopolymerization initiators including the specific polymerization initiator and other polymerization initiators which may be used in combination with the specific polymerization initiator.

<Polymerization Inhibitor>

From the viewpoints of attaining high sensitivity and suppressing undesirable during reaction, the ink composition of the invention preferably includes a polymerization inhibitor.

Examples of the polymerization inhibitor include p-methoxyphenol, hydroquinone, methoxybenzoquinone, phenothiazine, catechols, alkylphenols, alkylbisphenols, zinc dimethyl dithiocarbamate, copper dimethyl dithiocarbamate, copper dibutyl dithiocarbamate, copper salicylate, thiodipropionates, mercaptobenzimidazole, phosphites, and hindered amine stabilizers (HALS), and p-methoxyphenol, catechols, phenols, and hindered amine stabilizers (HALS) are preferable.

Only one species of polymerization inhibitors may be used, of a combination of two or more of them may be used.

The amount of the polymerization inhibitor to be added is preferably from 200 to 20,000 ppm, more preferably from 300 to 10,000 ppm, and still more preferably from 500 to 10,000 ppm, with respect to the total mass of the ink composition.

<Other Components>

[Polymer having, at side chain thereof, partial structure selected from the group consisting of fluorine-substituted hydrocarbon group, siloxane skeleton, and long-chain alkyl group]

The ink composition of the invention including the compound having a persulfide bond, the radical polymerizable compound, and the photopolymerization initiator. The ink composition of the invention may include an optional polymerization inhibitor, as well as a polymer (which may be referred to as "surface segregation polymer" hereinafter) having, at a side chain thereof, a partial structure selected from the group consisting of a fluorine-substituted hydrocarbon group, a siloxane skeleton, and a long-chain alkyl group.

When the surface segregation polymer exists at the surface of a cured film form from the ink composition (i.e., ink surface of an ink image), leaking of monomers and volatile components remaining in the ink composition and blocking may be suppressed.

The surface segregation polymer is a polymer having, at a side chain thereof, a partial structure selected from the group consisting of 1) a fluorine-substituted hydrocarbon group, 2) a siloxane skeleton, and 3) a long-chain alkyl group.

[1] Fluorine-Substituted Hydrocarbon Group]

The fluorine-substituted hydrocarbon group in a surface segregation polymer may be a hydrocarbon group substituted by at least one fluorine atom. Examples thereof include a fluoroalkyl group and a fluoroalkylene group, which are obtained by substituting at least one hydrogen atom of an alkyl group or an alkylene group with at least one fluorine atom. It is more preferable to use a perfluoroalkyl group or a perfluoroalkylene group, obtained by substituting all of the hydrogen atoms of an alkyl group or alkylene group is substituted with fluorine atoms, and a perfluoroalkyl group is still more preferable.

Examples of the surface segregation polymer having, at a side chain thereof, a partial structure having a fluorine-substituted hydrocarbon group include polymers disclosed in paragraphs [0047] to [0093] of JP-A No. 2009-079152.

[2) Siloxane Skeleton]

The siloxane skeleton to be included in the surface segregation polymer is not particularly limited as long as the siloxane skeleton includes "—Si—O—Si—".

In the invention, the surface segregation polymer having a siloxane skeleton is preferably a compound including, at a side chain thereof, a structural unit having a siloxane skeleton, from the viewpoints of improving ejection stability of the ink composition and enhancing localization of the surface segregation polymer at the surface of a film formed from the ink composition.

A siloxane compound useful for introducing a siloxane skeleton into a molecule of the surface segregation polymer may be commercially available, examples of which including one-terminal reactive silicones such as X-22-173DX and X-22-173BX (trade names, manufactured by Shin-Etsu Chemical Co., Ltd.).

Alternatively, the siloxane compound may be synthesized by reacting a siloxane having a reactive terminal with a compound having a cation-polymerizable group. For example, a siloxane compound may be synthesized from a compound having a one-terminal hydroxyl group, such as SILAPLANE FM-0411, FM-0421, and FM-0425 (trade name, manufactured by Chisso Corporation) and epichlorohydrin, or may be synthesized by a method as described in JP-A No. 11-80315.

Examples of the siloxane skeleton to be used in the invention include the structures shown below, but not limited thereto.

(a2-7)

(a2-8)

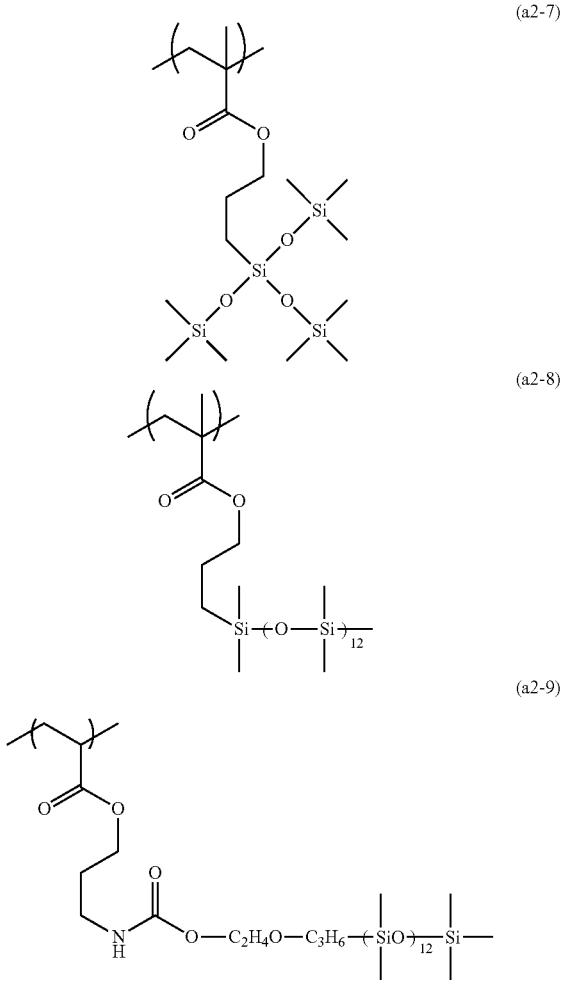

(a2-9)

[3) Long-Chain Alkyl Group]

The 3) long-chain alkyl group which may be included in the surface segregation polymer is preferably an alkyl group having at least 6 carbon atoms, and may be straight-chain, branched or cyclic, but a straight-chain alkyl group is more preferable. The long-chain alkyl group is more preferably an alkyl group having 6 to 40 carbon atoms, still more preferably from 6 to 18 carbon atoms, and further more preferably from 6 to 12 carbon atoms.

The alkyl group which has at least 6 carbon atoms and is present at a side chain of the surface segregation polymer is a substituent represented by —$C_nH_{2n+1}$ shown in the following Formula (A), and it is preferable to use a surface segregation polymer including a structural unit represented by the following Formula (A) so that the alkyl group which has at least 6 carbon atoms is introduced into the polymer.

Formula (A)

In Formula (A), n represents an integer of from 6 to 40, preferably an integer of from 6 to 18, and more preferably an integer of from 6 to 12, from the viewpoint of segregation property, and m represents the number of structural units represented by Formula (A).

Y represents a polymer main chain, and —$C_nH_{2n+1}$ (i.e., an alkyl group having at least 6 carbon atoms) is bonded to the main chain directly or via a linking group.

W represents a single bond or a linking group, and when W represents a single bond, the long-chain alkyl group is directly bonded to the polymer main chain. $Z^1$ represents a hydrogen atom or a monovalent substituent.

The structural unit represented by Formula (A) may have plural alkyl groups each having at least 6 carbon atoms. Exemplary embodiments the structural unit represented by Formula (III) in which the structural unit represented by Formula (A) has plural alkyl groups each having at least 6 carbon atoms include an embodiment in which an alkyl group having at least 6 carbon atoms is bonded at the position of $Z^1$ via a linking group W, en embodiment in which the linking group W has a branched or cyclic structure, and another alkyl group having at least 6 carbon atoms is linked to any one of the carbon atoms that is included in the linking group W, or the like.

Examples of W include: a straight-chain, branched or cyclic alkylene group having 1 to 20 carbon atoms, a straight-chain, branched or cyclic alkenylene group having 2 to 20 carbon atoms, an alkynyl group having 2 to 20 carbon atoms, an arylene group (which may be monocyclic or heterocyclic) having 6 to 20 carbon atoms, —OC(=O)—, —OC(=O)Ar—, —OC(=O)O—, —OC(=O)OAr—, —C(=O)NR—, —C(=O)NAr—, —SO₂NR—, —SO₂NAr—, —O— (alkyleneoxy, polyalkyleneoxy), —OAr— (aryleneoxy, polyaryleneoxy), —C(=O)O—, —C(=O)O—Ar—, —C(=O)Ar—, —C(=O)—, —SO₂O—, —SO₂OAr—, —OSO₂—, —OSO₂Ar—, —NRSO₂—, —NArSO₂—, —NRC(=O)—, NArC(=O)—, —NRC(=O)O—, —NArC(=O)O—, —OC(=O)NR—, —OC(=O)NAr—, —NAr—, —NR—, —N+RR'—, —N+RAr—, —N+ArAr'—, —S—, —SAr—, —ArS—, a heterocyclic group (examples of which include a 3-membered to 12-membered monocycle or condensed ring including at least 1 hetero atom such as a nitrogen atom, an oxygen atom, or a sulfur atom), —OC(=S)—, —OC(=S)Ar—, —C(=S)O—, —C(=S)OAr—, —C(=S)OAr—, —C(=O)S—, —C(=O)SAr—, —ArC(=O)—, —ArC(=O)NR—, —ArC(=O)NAr—, —ArC(=O)O—, —ArC(=O)O—, —ArC(=O)S—, —ArC(=S)O—, —ArO—, and —ArNR—.

In the above description, R and R' each independently represents a hydrogen atom, a straight-chain or branched alkyl group, a linear or cyclic alkyl group, a straight-chain or branched alkenyl group, a linear or cyclic alkenyl group, a straight-chain or branched alkynyl group, or a linear or cyclic alkynyl group; and Ar and Ar' each independently represents an aryl group.

Of these linking groups, it is preferable to use an arylene group (which may be monocyclic or heterocyclic) having 6 to 20 carbon atoms, —C(=O)NR—, —C(O)NAr—, —O— (alkyleneoxy, polyalkyleneoxy), —OAr— (aryleneoxy, polyaryleneoxy), —C(=O)O—, —C(=O)O—Ar—, —C(=O)—, —C(=O)Ar—, —S—, —SAr—, —ArS—, —ArC(=O)—, —ArC(=O)O—, —ArC(=O)O—, —ArO—, or —ArNR—, and it is more preferable to use an arylene group (which may be monocyclic or heterocyclic) having 6 to 20 carbon atoms, —C(=O)NR—, —C(O)NAr—, —O— (alkyleneoxy, polyalkyleneoxy), —OAr— (aryleneoxy, polyaryleneoxy), —C(=O)O—, —C(=O)O—Ar—, —SAr—, —ArS—, —ArC(=O)—, —ArC(=O)O—, —ArC(=O)O—, —ArO—, or —ArNR—.

In the invention, the linking group represented by W may be a combination of at least two of the linking groups mentioned above.

Hereinbelow, specific examples of the divalent substituent represented by W, which is particularly preferable from the viewpoint of surface segregation property, are shown, but the divalent substituent represented by W is not limited thereto.

W:

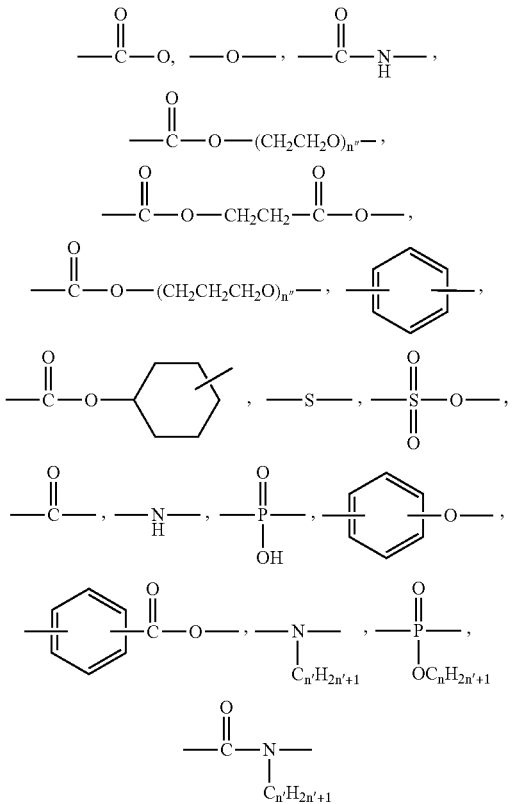

($n'$ = from 1 to 40, $n''$ = from 1 to 20)

Furthermore, examples of $Z^1$ include the groups as shown below, as well as embodiment in which a long-chain alkyl group is bonded via the linking group W. In this case, the surface segregation polymer may have a long-chain alkyl group by having $Z^1$ when m represents an integer of 6 to 20.

$Z^1$:

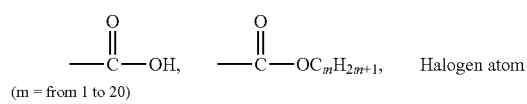

($m$ = from 1 to 20)

Examples of the structural unit having a long-chain alkyl group, which is included in the surface segregation polymer to be used in the invention, are shown below, but not limited to.

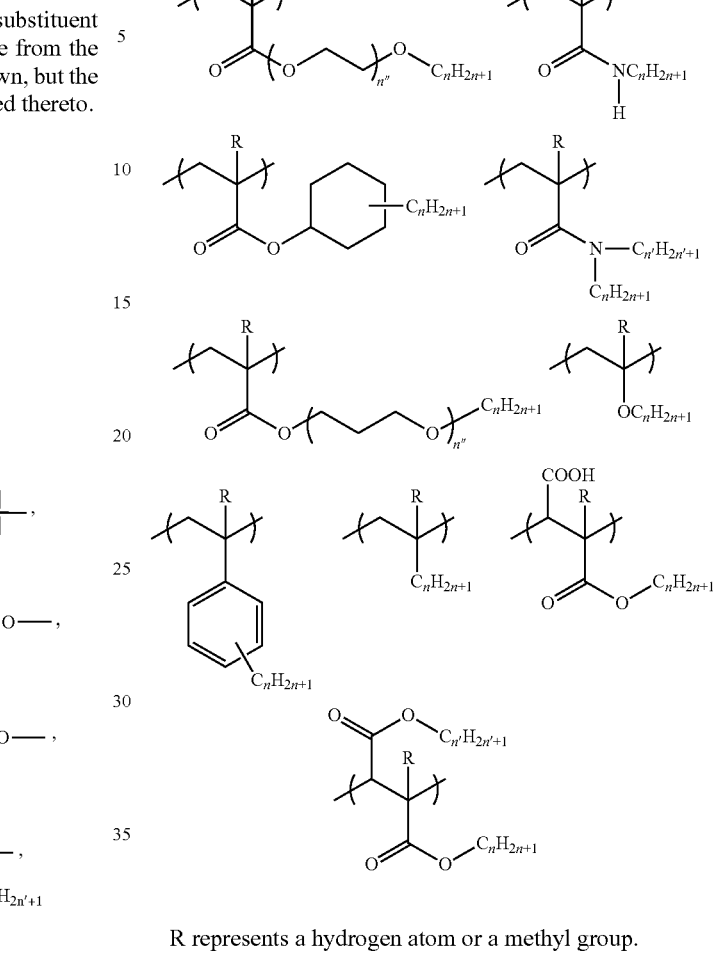

R represents a hydrogen atom or a methyl group.
n=from 6 to 40; n'=from 1 to 40; n"=from 1 to 20

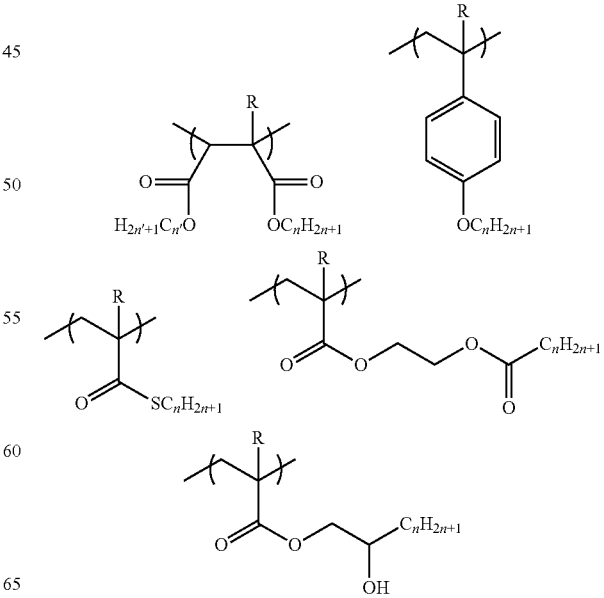

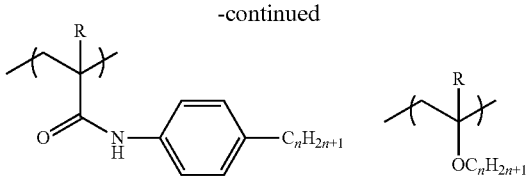

R represents a hydrogen atom or a methyl group.
n=from 6 to 40; n'=from 1 to 40

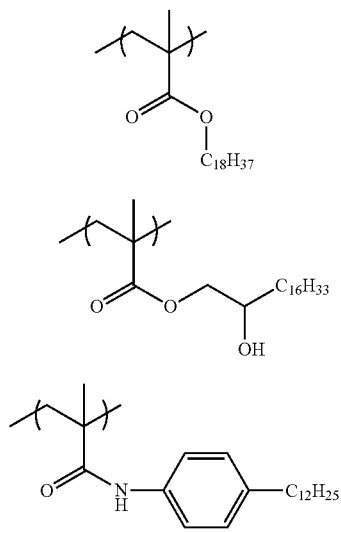

The contents of the partial structures selected from the group consisting of 1) the fluorine-substituted hydrocarbon group, 2) the siloxane skeleton, and 3) the long-chain alkyl group in the surface segregation polymer are each preferably from 3 to 60% by mass, more preferably from 3 to 50% by mass, and still more preferably from 5 to 40% by mass.

When the contents are within the above ranges, the surface segregation polymer can be efficiently localized at the surface of a film formed from the ink composition.

When the surface segregation polymer contains at least two partial structures selected from the group consisting of 1) the fluorine-substituted hydrocarbon group, 2) the siloxane skeleton, and 3) the long-chain alkyl group, the total content of the specific moieties is from 3 to 60% by mass, more preferably from 3 to 50% by mass, and still more preferably from 5 to 40% by mass, with respect to the surface segregation polymer.

The amount of the partial structure selected from the group consisting of 1) the fluorine-substituted hydrocarbon group, 2) the siloxane skeleton, and 3) the long-chain alkyl group is preferably from 0.1 to 20% by mass, more preferably from 0.5 to 15% by mass, and still more preferably from 1 to 10% by mass, in the total solid content of the ink composition. When the amount is within the above ranges, excellent surface curing property and excellent blocking suppression may be attained, and a surface tension (22 mN/m to 28 mN/m) at which an ink can be ejected and suitable viscosity may be obtained.

[Radical Polymerizable Group]

The surface segregation polymer may have a radical polymerizable group at a side chain thereof.

When the surface segregation polymer contains a radical polymerizable group, the surface of a cured film formed from the ink composition can be more strongly coated with the polymer. Accordingly, even when volatile components are remaining in the cured film, leaking or elution of the volatile components can be prevented. As a result, sticky texture at the surface of the base material at which an image is printed can be suppressed, and blocking property may be improved.

This is because, when a film is formed by applying the ink composition by coating or the like on a base material, the surface segregation polymer is localized at the surface of the film, and the polymerizable groups of the surface segregation polymer undergo polymerization, whereby the film surface is covered with the cured surface segregation polymer.

The radical polymerizable group may be a polymerizable group which has an ethylenic unsaturated bond and is capable of undergoing radical polymerization.

Examples of the polymerizable group which has an ethylenic unsaturated bond and is capable of undergoing radical polymerization include: unsaturated carboxylic ester groups such as an acrylate ester group, a methacrylate ester group, an itaconate ester group, a crotonate ester group, an isocrotonate ester group, and a maleate ester group; and a styrene group. In particular, a methacrylate ester group or an acrylate ester group is preferable.

The content of the radical polymerizable group in the surface segregation polymer is preferably from 5 to 90 mol %, more preferably from 5 to 85 mol %, and still more preferably from 10 to 80 mol %.

As a method of introducing a radical polymerizable group into a surface segregation polymer, a method in which a monomer of a radical polymerizable group of which reactive double bond has been blocked using a protective group is copolymerized, and then the protective group was removed to obtain a radical polymerizable group (having a double bond), or a method in which a low-molecular-weight compound having a radical polymerizable group is introduced into a surface segregation polymer by polymer reaction, may be used.

Specific examples of the radical polymerizable group is shown below, but not particularly limited thereto.

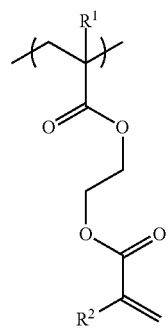

$R^1 = H, R^2 = H$ (a3-1)
$R^1 = H, R^2 = CH_3$ (a3-2)
$R^1 = CH_3, R^2 = H$ (a3-3)
$R^1 = CH_3, R^2 = CH_3$ (a3-4)

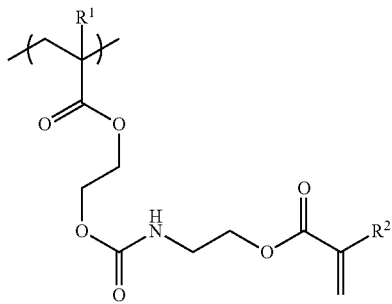

R¹ = H, R² = H (a3-5)
R¹ = H, R² = CH₃ (a3-6)
R¹ = CH₃, R² = H (a3-7)
R¹ = CH₃, R² = CH₃ (a3-8)

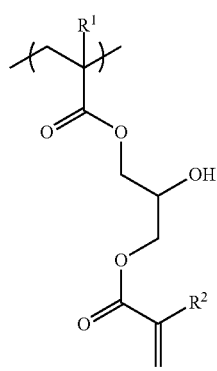

R¹ = H, R² = H (a3-9)
R¹ = H, R² = CH₃ (a3-10)
R¹ = CH₃, R² = H (a3-11)
R¹ = CH₃, R² = CH₃ (a3-12)

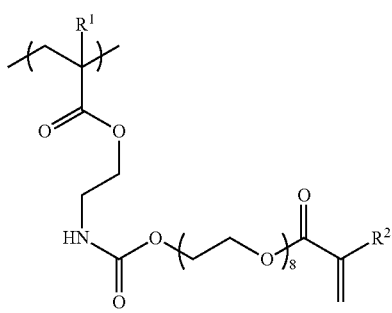

R¹ = H, R² = H (a3-13)
R¹ = H, R² = CH₃ (a3-14)
R¹ = CH₃, R² = H (a3-15)
R¹ = CH₃, R² = CH₃ (a3-16)

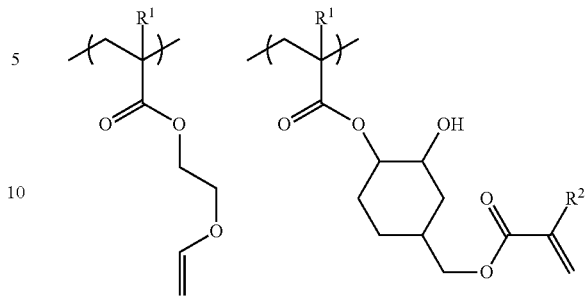

R¹ = H (a3-17)
R¹ = H (a3-18)

R¹ = H, R² = H (a3-19)
R¹ = H, R² = CH₃ (a3-20)
R¹ = CH₃, R² = H (a3-21)
R¹ = CH₃, R² = CH₃ (a3-22)

The surface segregation polymer may further include a copolymerization component (additional copolymerization component) having a structure other than the partial structure selected from the group consisting of 1) the fluorine-substituted hydrocarbon group, 2) the siloxane skeleton, and 3) the long-chain alkyl group or the radical polymerizable group. The additional copolymerization component is preferably used in the surface segregation polymer from the viewpoints of improving solubility in the ink composition and improving the blocking property by controlling a polymer Tg.

The additional polymerization component is not particularly limited as long as it is derived from a radical polymerizable monomer, but is preferably a monomer having an unsaturated double bond, and particularly preferably an acrylate or a methacrylate from the viewpoints of copolymerization ability and solubility of the obtained polymer in the ink composition. The amount of the additional copolymerization component in the surface segregation polymer is preferably from 0 to 70 mol %, more preferably from 0 to 50 mol %, and most preferably from 0 to 30 mol %.

The main chain structure of the surface segregation polymer included in the ink composition of the invention is preferably a methacrylic resin or an acrylic resin.

In a preferable embodiment, the main chain structure of the surface segregation polymer is synthesized by radical chain polymerization. In another preferable embodiment, the surface segregation polymer is a polymer having, as the main chain structure thereof, a urethane structure and a urea structure as repetition units.

The surface segregation polymer has a weight-average molecular weight of preferably from 5,000 to 200,000, more preferably from 5,000 to 100,000, and still more preferably from 5,000 to 80,000. When the weight-average molecular weight is within the above ranges, suitable viscosity and favorable curing property can be obtained.

Specific examples (a-1 to a-22) of the surface segregation polymer are shown below, but the surface segregation polymer is not limited thereto.

a-1
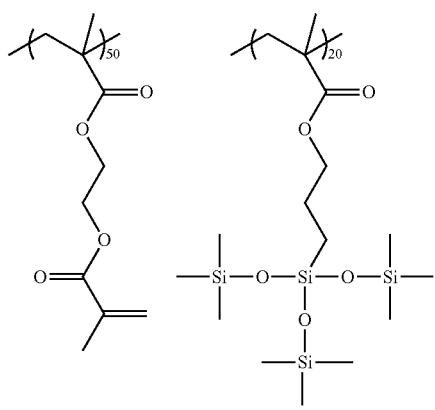
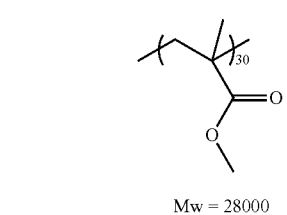
Mw = 28000
a-2
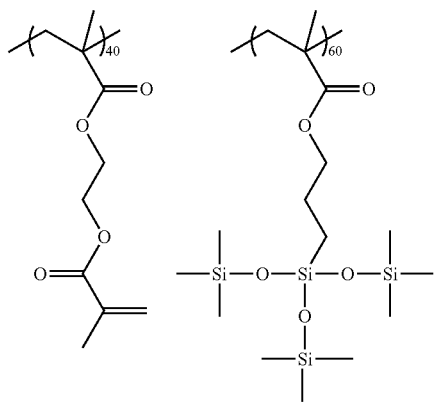
Mw = 30000
a-3
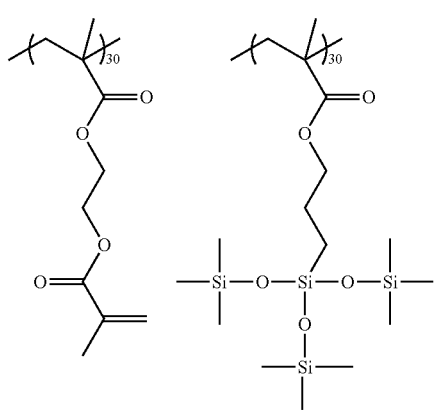
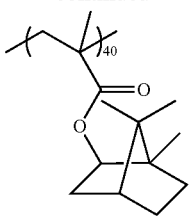
Mw = 30000
a-4
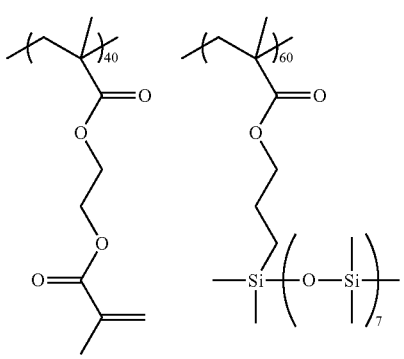
Mw = 33000
a-5
Mw = 43000
a-6
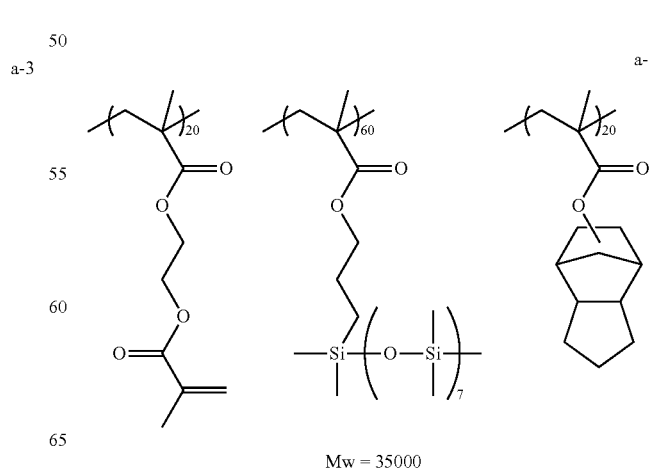
Mw = 35000

-continued
a-7
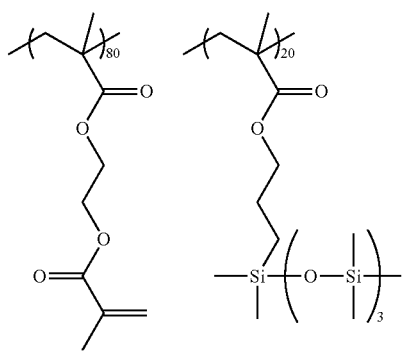
Mw = 30000
a-8
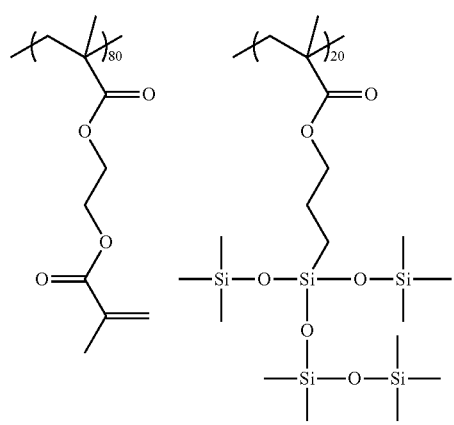
Mw = 28000
a-9
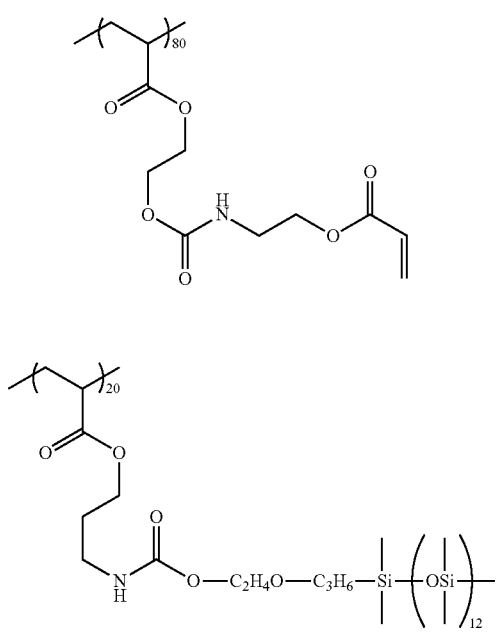
Mw = 25000
a-10
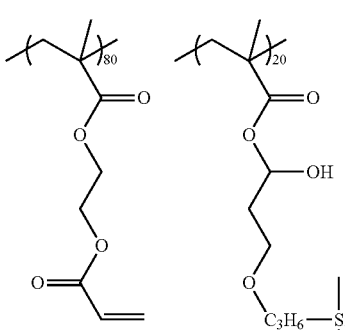
Mw = 40000
a-11
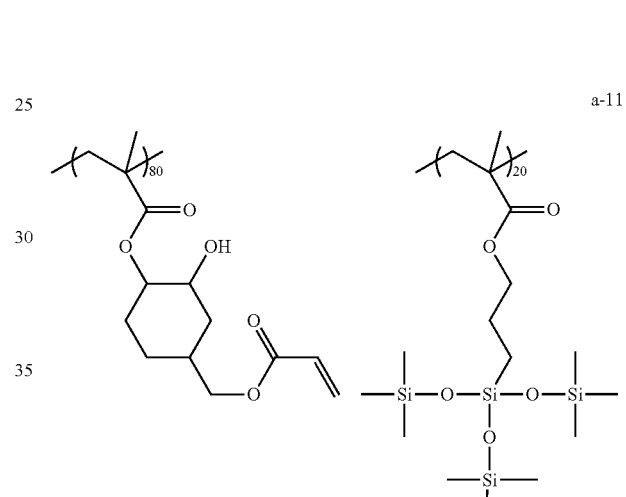
Mw = 38000
a-12
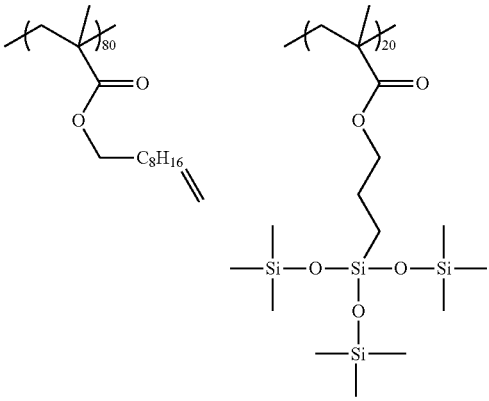
Mw = 28000 a-13
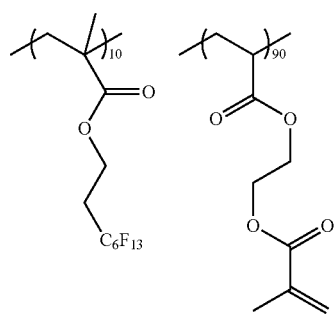
Mw = 46000
a-16
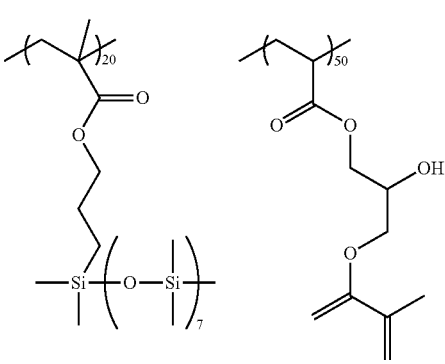
a-14
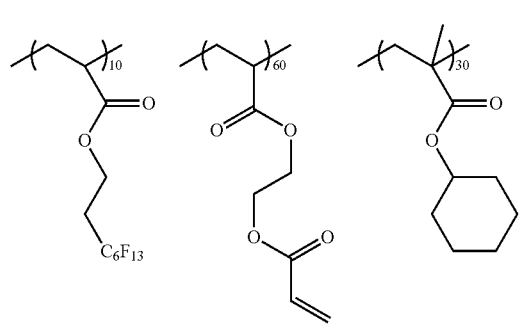
Mw = 52000
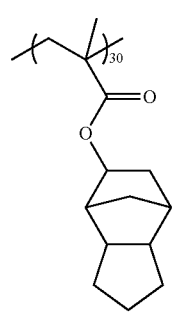
Mw = 72000
a-15
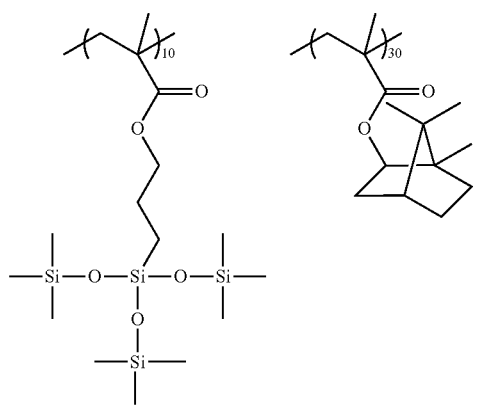
a-17
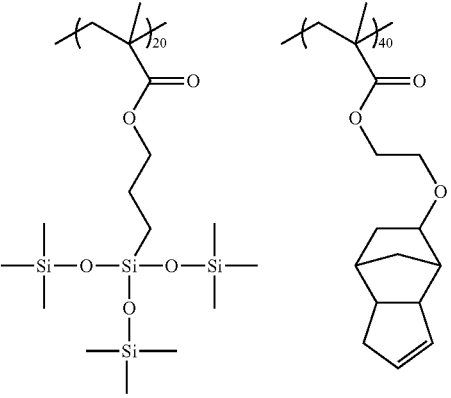
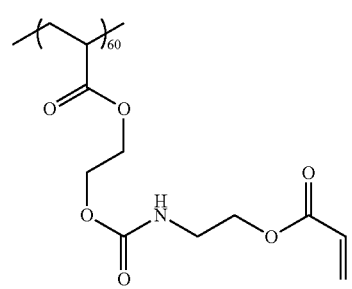
Mw = 55000
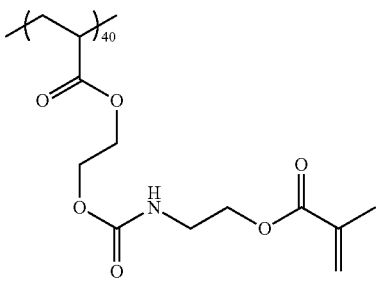
Mw = 38000 a-18

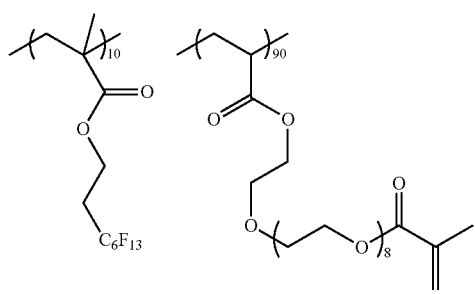

Mw = 52000 a-19

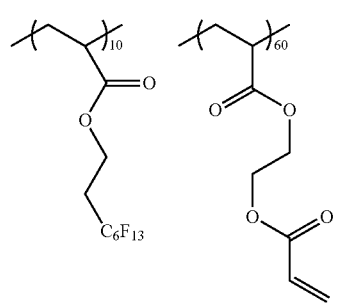

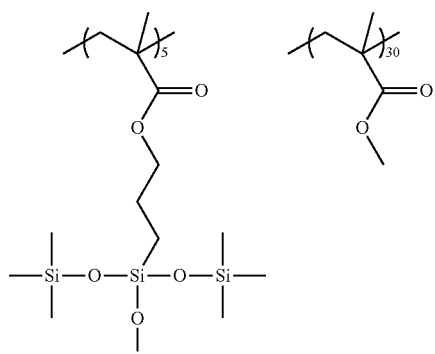

Mw = 40000 a-20

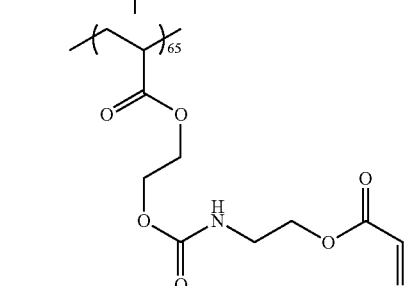

Mw = 36000 a-21

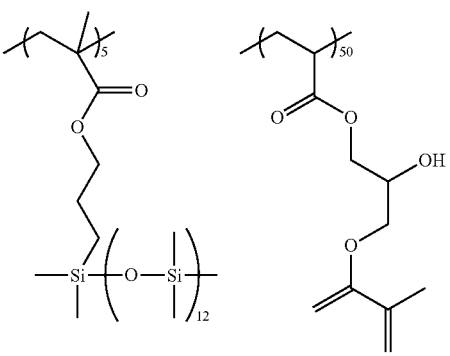

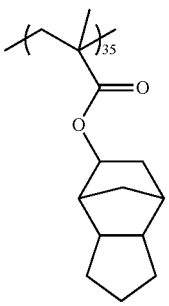

Mw = 28000 a-22

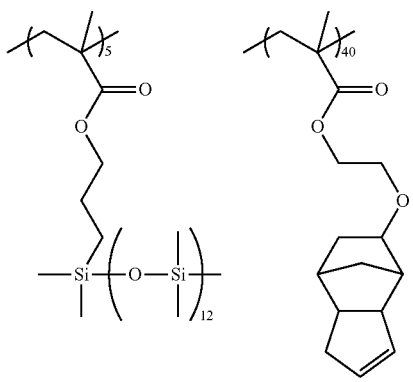

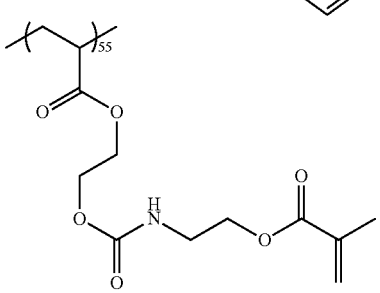

Mw = 35000

A commercially-available product may be used as the surface segregation polymer, and examples thereof include BYK-UV3500 (polydimethyl siloxane having a polyether-modified acrylic group), BYK-UV3510 (polyether-modified polydimethyl siloxane), and BYK-UV3570 (polydimethyl siloxane having a polyester-modified acrylic group) (all trade names, manufactured by BYK Chemie).

The content of the surface segregation polymer included in the ink composition is preferably from 0.03 to 5% by mass, more preferably from 0.1 to 4% by mass, and still more preferably from 0.5 to 2% by mass, with respect to the total solid content in the ink composition.

<Colorant>

The ink composition of the invention may further include a colorant in accordance with the purpose. When the ink composition contains a colorant, an ink composition with which a visible image (color image) can be formed is obtained.

The colorant to be used in the ink composition is not particularly limited, and any one of various known colorants (including pigments and dyes) may be selected and used in depending on the application. For example, for forming an image having excellent weather resistance, a pigment is preferably used. Regarding the dyes, either a water-soluble dye or an oil-soluble dye may be used, but an oil-soluble dye is preferable.

—Pigment—

First, description is given to a pigment which is preferably used as the colorant in the ink composition. When a pigment is used as the colorant, excellent weather resistance can be imparted to a color image formed using the ink composition.

The pigment is not particularly limited, and any one of commercially-available organic pigments and inorganic pigments, a product obtained by dispersing a pigment in an insoluble resin or the like as a dispersing medium, a pigment having a surface on which a resin is grafted, and the like may be used. Alternatively, a resin particle colored with a dye may be used.

Examples of the pigment include pigments disclosed in, for example, Seijiro Ito, "Ganryo no Jiten" (2000); W. Herbst, K. Hunger "Industrial Organic Pigments"; JP-A Nos. 2002-12607, 2002-188025, 2003-26978, and 2003-342503.

Specific examples of the organic pigments and inorganic pigment which may be used in the invention include compounds disclosed in paragraphs [0126] to [0131] of JP-A No. 2008-13646, and any one of the compounds may be used in the invention.

The pigment may be dispersed using, for example, a dispersion apparatus such as a ball mill, a sand mill, an atrritor, a roll mill, a jet mill, a homogenizer, a paint shaker, a kneader, an agitator, a HENSCHEL mixer, a colloid mill, an ultrasonic homogenizer, a pearl mill, or a wet-type jet mill.

A dispersant may be added when the pigment is dispersed. Examples of the dispersant include hydroxyl group-containing carboxylic acid esters, salts of long-chain polyaminoamides and high-molecular-weight acid esters, salts of high-molecular-weight polycarboxylic acids, high-molecular-weight unsaturated acid esters, copolymers of polymers, modified polyacrylates, aliphatic polyvalent carboxylic acids, naphthalenesulfonic acid/formalin condensates, polyoxyethylene alkyl phosphates, and pigment derivatives. It may be preferable to use a commercially-available polymer dispersant such as SOLSPERSE series available from The Lubrizol Corporation.

As a dispersion aid, a synergist may be used depending on the various pigments. It is preferable that the dispersant and the dispersion aid be added in an amount of from 1 to 50 parts by mass with respect to 100 parts by mass of the pigment.

In the ink composition, a solvent may be added as a dispersion medium for dispersing various components such as the pigment. Alternatively, the polymerizable compound which is a low-molecular-weight component may be used as a dispersion medium with no solvent added. However, since the ink composition of the invention is a radiation-curable ink and the ink is cured after being applied onto a recording medium, it is preferable that no solvent be used. The reason therefor is that, if a solvent is left in an image formed by the cured ink, the solvent resistance may deteriorate, and problems caused by the volatile organic compound (VOC) included in the remaining solvent may arise. In this regard, it is preferable to use a polymerizable compound as a dispersant, and is particularly preferable to use a polymerizable compound selected from cation-polymerizable monomers having the lowest viscosities, from the viewpoints of dispersion suitability and improvement in handling property of the ink composition.

A volume-average particle diameter of pigment particles in the ink composition is preferably from 0.02 μm to 0.60 μm, and more preferably from 0.02 μm to 0.10 μm. The maximum particle diameter is preferably 3 μm or less, and more preferably 1 μm or less, and the pigment, dispersant, and dispersion medium, the dispersion conditions, and the filtration conditions are appropriately selected so that the particle diameter falls within the above ranges. By controlling the particle diameter, clogging of a head nozzle can be suppressed, and favorable ink storage stability, ink clarity, and curing sensitivity can be attained.

—Dye—

Next, description is given to a dye which may be preferably used as the colorant to be used in the invention.

As the dye, any one appropriately selected from conventionally known compounds (i.e., dyes) may be used. Specific examples thereof include compounds as disclosed in paragraphs [0023] to [0089] of JP-A No. 2002-114930 and paragraphs [0136] to [0140] of JP-A No. 2008-13646, and any one of the compounds may be used in the invention.

The colorant is added to the ink composition in an amount of preferably from 0.05 to 20% by mass, and more preferably from 0.2 to 10% by mass, with respect to the total mass of the ink composition. When an oil-soluble dye is used as the colorant, the amount of the oil-soluble dye is preferably from 0.2 to 6% by mass with respect to the total mass (including the solvent) of the ink composition.

<Co-Sensitizer>

The ink composition of the invention may further include a co-sensitizer. In the invention, the co-sensitizer may function to enhance the sensitivity of the sensitizing dye to active radiation, or to suppress polymerization inhibition of the polymerizable compound, which is caused by oxygen.

Examples of the co-sensitizer include: amines such as compounds as disclosed in, for example, M. R. Sander et al., "Journal of Polymer Science", vol. 10, p. 3173 (1972), Examined Japanese Patent Application Publication No. 44-20189, JP-A Nos. 51-82102, 52-134692, 59-138205, 60-84305, 62-18537, and 64-33104, and Research Disclosure vol. 33825, and specific examples include triethanolamine, ethyl p-dimethylaminobenzoate, p-formyldimethylaniline, and p-methylthiodimethylaniline.

Other examples of the co-sensitizer include amino acid compounds (for example, N-phenylglycine), organic metal compounds disclosed in Examined Japanese Patent Application Publication No. 48-42965 (for example, tributyltin acetate), hydrogen-donating compounds disclosed in Examined Japanese Patent Application Publication No. 55-34414, sulfur compounds disclosed in JP-A No. 6-308727 (for example, trithiane), phosphor compounds disclosed in JP-A No. 6-250387 (for example, diethyl phosphite), and Si—H and Ge—H compounds disclosed in JP-A No. 8-65779.

<Ultraviolet Absorber>

The ink composition of the invention may further include an ultraviolet absorber from the viewpoints of improving weather resistance and preventing discoloration of the obtained image.

Examples of the ultraviolet absorber include: benzotriazole compounds disclosed in, for example, JP-A Nos.

58-185677, 61-190537, 2-782, 5-197075, and 9-34057; benzophenone compounds disclosed in, for example, JP-A Nos. 46-2784 and 5-194483, and U.S. Pat. No. 3,214,463; cinnamic acid compounds disclosed in, for example, Japanese Patent Application Publication Nos. 48-30492 and 56-21141 and JP-A No. 10-88106; triazine compounds disclosed in, for example, JP-A Nos. 4-298503, 8-53427, 8-239368, 10-182621, and 8-501291; and compounds disclosed in Research Disclosure No. 24239, and compounds that absorb ultraviolet ray and emit fluorescence, that is, so-called fluorescent brighteners, which are typified by stilbene compounds and benzoxazole compounds.

The amount to be added is appropriately selected depending on the purpose, but, in general, is preferably from 0.5 to 15% by mass in terms of solid content.

<Antioxidant>

The ink composition of the invention may further include an antioxidant for improving stability.

Examples of the antioxidant includes those disclosed, for example, in EP Patent Nos. 223739, 2309401, 309402, 310551, 310552, and 459416, DE Patent No. 3435443, JP-A Nos. 54-48535, 62-262047, 63-113536, 63-163351, 2-262654, 2-71262, 3-121449, 5-61166, and 5-119449, and U.S. Pat. Nos. 4,814,262 and 4,980,275.

The amount to be added is appropriately selected depending on the purpose, but is preferably from 0.1 to 8% by mass in terms of solid content.

<Discoloration Inhibitor>

The ink composition of the invention may further include any one of various organic and metal complex discoloration inhibitors.

Examples of the organic discoloration inhibitors include hydroquinones, alkoxyphenols, dialkoxyphenols, phenols, anilines, amines, indanes, chromanes, alkoxyanilines, and hetero rings.

Examples of the metal complex discoloration inhibitors include nickel complexes and zinc complexes. Specifically, any one of the compounds disclosed in the patent publications cited in Research Disclosure No. 17643, VII-I to VII-J, Research Disclosure No. 15162, Research Disclosure No. 18716, p. 650, left column, Research Disclosure No. 36544, p. 527, Research Disclosure No. 307105, p. 872, and Research Disclosure No. 15162, and the compounds encompassed within the general formula and exemplary compounds of the representative compounds, which are disclosed in pp. 127-137 of JP-A No. 62-215272.

The amount to be added is appropriately selected depending on the purpose, but is preferably from 0.1 to 8% by mass in terms of solid content.

<Conductive Salts>

The ink composition of the invention may further include a conductive salt such as potassium thiocyanate, lithium nitrate, ammonium thiocyanate, or dimethylamine hydrochloride, for the purpose of controlling physical property upon ejection.

<Solvent>

A minute amount of a non-curable organic solvent may be added to the ink composition in order to improve adhesiveness between the ink composition and a recording medium (base material).

Examples of the solvent include: ketone solvents such as acetone, methyl ethyl ketone, and diethylketone; alcohol solvents such as methanol, ethanol, 2-propanol, 1-propanol, 1-butanol, and tert-butanol; chlorine-containing solvents such as chloroform and methylene chloride; aromatic solvents such as benzene and toluene; ester solvents such as ethyl acetate, butyl acetate, and isopropyl acetate; ether solvents such as diethyl ether, tetrahydrofuran, and dioxane; and glycol ether solvents such as ethylene glycol monomethyl ether and ethylene glycol dimethyl ether.

It is effective to add a solvent in such an amount that does not cause problems to solvent resistance, VOC, and the like, and the amount is preferably from 0.1 to 5% by mass, and more preferably from 0.1 to 3% by mass, with respect to the entire ink composition.

<Polymer Compound>

Any one of various polymer compounds other than the surface modified polymer may be added to the ink composition of the invention in order to control the physical property of the film.

Examples of the polymer compounds include acrylic polymers, polyvinyl butyral resins, polyurethane resins, polyamide resins, polyester resins, epoxy resins, phenol resins, polycarbonate resins, polyvinyl butyral resins, polyvinyl formal resins, shellac, vinyl resins, acrylic resins, rubber resins, waxes, and other natural resins. A combination of two or more of the polymer compounds may be used. In particular, a vinyl copolymer obtained by copolymerization of acrylic monomers is preferable. Furthermore, a copolymer having, as a structural unit, "a carboxyl group-containing monomer", "an alkyl methacrylate" or "an alkyl acrylate" as a copolymerization formulation of a polymer binder is preferably used.

<Surfactant>

The ink composition of the invention may further include a surfactant.

Examples of the surfactant include those disclosed in JP-A Nos. 62-173463 and 62-183457. Specific examples thereof include: anionic surfactants such as dialkyl sulfosuccinates, alkyl naphthalene sulfonates, and aliphatic acid salts; nonionic surfactants such as polyoxyethylene alkyl ethers, polyoxyethylene alkyl allyl ethers, acetylene glycols, and polyoxyethylene/polyoxypropylene block copolymers; and cationic surfactants such as alkylamine salts and quaternary ammonium salts.

Alternatively, an organic fluoro compound may be used instead of the surfactant.

The organic fluoro compound is preferably hydrophobic. Examples of the organic fluoro compound include fluorine-containing surfactants, oily fluorine-containing compounds (for example, fluorinated oil), and solid fluorine-containing resins (for example, tetrafluoroethylene resins), and more specifically, those disclosed in Japanese Patent Application Publication No. 57-9053 (columns 8-17) and JP-A No. 62-135826.

<Other Additives>

If needed, any other additives such as a leveling additive, a matting agent, waxes for controlling the physical property of the film, or a tackifier, which does not inhibit polymerization, for improving adhesiveness to a recording medium made of polyolefin, PET, or the like, may be added to the ink composition.

Specifically, the tackifier may be a high-molecular-weight adhesive polymer disclosed in pp. 5-6 of JP-A No. 2001-49200 (for example, copolymers obtained from an ester of (meth)acrylic acid and an alcohol having an alkyl group having 1 to 20 carbon atoms, an ester of (meth)acrylic acid and an alicyclic alcohol having 3 to 14 carbon atoms, and an ester of (meth)acrylic acid and an aromatic alcohol having 6 to 14 carbon atoms), or a low-molecular-weight adhesion-imparting resin having a polymerizable unsaturated bond.

[Preferable Physical Properties of Ink Composition]

When the ink composition is applied to inkjet recording, the ink composition has a viscosity at a temperature at ink ejection (for example, from 40° C. to 80° C., and more preferably from 25° C. to 30° C.) of preferably from 7 to 30 mPa·s, and more preferably from 7 to 20 mPa·s, in view of ejection property. For example, the ink composition has a viscosity at room temperature (25° C. to 30° C.) of preferably from 35 to 500 mPa·s, and more preferably from 35 to 200 mPa·s.

It is preferable to appropriately control the formulation of the ink composition so that the viscosity thereof falls within the above ranges. When the viscosity at room temperature is adjusted to a higher degree, ink penetration into a recording medium can be prevented even when a porous recording medium is used, and remaining of uncured monomer can be suppressed, and odor can be reduced. Furthermore, ink bleeding at the landing of ink droplets can be suppressed; and as a result, higher image quality can be obtained.

The ink composition has a surface tension of preferably from 20 to 30 mN/m, and more preferably from 23 to 28 mN/m. When recording is carried out on various recording media such as a polyolefin recording medium, a PET recording medium, coat paper, non-coat paper, or the like, the surface tension is preferably 20 mN/m or less from the viewpoints of bleeding and penetration, and is preferably 30 mN/m or less from the viewpoint of wettability.

The ink composition is preferably used for inkjet recording. When used in inkjet recording, the recording is carried out in such a manner that the ink composition is ejected onto a recording medium using an inkjet recording apparatus, and the ejected ink composition is then irradiated with radiation to cure the ink composition.

On a printed matter obtained by using the ink composition, an image portion is cured by the irradiation of radiation such as ultraviolet ray, and the image portion has excellent strength. Therefore, in addition to the formation of an image, the ink composition may be used for various applications such as formation of an ink-receiving layer (image portion) of a planographic printing plate.

[Inkjet Recording Method and Printed Product]

Hereinafter, the inkjet recording method (inkjet recording method of the invention) in which the ink composition of the invention is preferably used is described in detail.

The inkjet recording method includes: ejecting the ink composition onto a recording medium (such as a support or recording material) from an inkjet recording apparatus; and irradiating the ejected ink composition with active radiation to cure the ink composition. The cured ink composition forms an image on the recording medium.

The recording medium (base material) which may be used in the inkjet recording method is not particularly limited, and examples thereof include: paper such as generally-used non-coat paper and coat paper; and various nonabsorbable resin materials used for soft packing, and resin films formed from the nonabsorbable resin materials. Examples of various plastic films include PET films, OPS films, OPP films, ONy films, PVC films, PE films, and TAC films. Furthermore, examples of plastics which may be used as a material of the recording medium include polycarbonate, acrylic resins, ABS, polyacetal, PVA, and rubbers. Alternatively, a recording medium made from a metal or glass may be used.

The recording medium which may be used in the invention may be a support of a planographic printing plate.

Examples of the active radiation to be used in the inkjet recording method include α-ray, γ-ray, X-ray, ultraviolet ray, visible light ray, infrared ray, and electron beam. The peak wavelength of the active radiation is preferably from 200 nm to 600 nm, more preferably from 300 nm to 450 nm, and still more preferably from 350 nm to 420 nm. The power of the active radiation is preferably 2,000 mJ/cm$^2$ or less, more preferably from 10 to 2,000 mJ/cm$^2$, still more preferably from 20 to 1,000 mJ/cm$^2$, and particularly preferably from 50 to 800 mJ/cm$^2$.

In the inkjet recording method, it is particularly preferable that the radiation be emitted from a light emitting diode such that an ultraviolet ray having a emission wavelength peak of 350 nm to 420 nm is emitted, and the maximum illumination intensity at the surface of the recording material is from 10 to 2,000 mW/cm$^2$. The ink composition can be cured at high sensitivity even when a light of lower exposure amount, such as a light emitting diode, is used.

In the inkjet recording method, since the ink composition of the invention is used, and is cured by irradiating it with active radiation, an image having excellent scratch resistance and having a surface of which sticky texture is suppressed may be formed. The irradiation with active radiation may be carried out at once after all of the ink compositions respectively having different colors are ejected, but it is preferable that light exposure is performed after each ink composition is ejected, from the viewpoint of promoting curing.

The printed matter obtained using the ink composition of the invention is a product on which an image is formed by the inkjet recording method using the ink composition.

Accordingly, the printed matter has an image having excellent scratch resistance and having a less sticky surface.

[Method of Producing Processed Printed Product]

The ink composition of the invention may exhibit less thermal shrinkage upon curing, and may have excellent adhesion to a base material (recording material). Therefore, when a printed matter is produced by applying the ink composition onto a surface of a recording medium made from a formable resin material, the printed matter has excellent processing suitability. Accordingly, the printed matter in which an image is printed on the resin surface using the ink composition is preferably used for production of a processed printed matter, such as a formed resin bottle, an advertising medium having a three-dimensional structure, or a dummy can, which is obtained by various forming processing such as vacuum processing.

Hereinafter, a method of producing a processed printed matter using the ink composition of the invention is described.

The recording medium to be used for a processed printed matter is any one of the resin materials which are exemplified as the resin films and plastics among the recording media, and the resin may be a thermoplastic resin or a thermosetting resin.

The method of producing a processed product of printed matter of the invention includes:

(1) ejecting the ink composition of the invention by an inkjet method onto a recording medium formed from a formable resin material to form an image;

(2) irradiating the obtained image with active radiation to cure the ink composition, thereby obtaining a printed matter having a cured image on the recording medium; and (3) subjecting the printed matter to forming processing.

Specifically, in the method of producing a processed printed matter of the invention, first, (1) the ink composition is ejected by an inkjet method onto a surface of such a recording medium formed from a resin material to form an image; then, (2) the obtained image is irradiated with active radiation to cure the ink composition, whereby a printed matter having a recording medium on which the image is cured is obtained; and then, (2) the obtained printed matter is subjected to forming processing to obtain a processed product of printed matter.

In an embodiment of the method of producing a processed product of printed matter, (4) the obtained printed matter may be subjected to punching processing.

The method of forming processing of a printed matter is not particularly limited, and any known method of forming processing of resin method may be appropriately used. Typical examples thereof are described below.

(Embossing)

As a method of forming processing in the method of producing a processed printed matter, embossing may be carried out. In an embossing method, a portion of a printed matter or the like is dented in a desired shape such as a drawing pattern or a letter so as to impart a three-dimensional appearance to the printed matter. For example, embossing may be carried out using a roller, a pressing machine, or the like.

An example of the embossing is a hot/cold pressing, and a method disclosed in JP-A No. 10-199360 or the like may be used as a reference.

An example of an embossing apparatus according to the hot/cold press method is described below.

In the embossing apparatus, a lower press platen and an upper press platen are arranged so that they can be contacted and isolated from each other. A plate-type heater is fixed on the lower press platen, and a plate-type heater is also fixed at the lower surface of the upper press platen. Therefore, hot pressing can be carried out while a recording medium is heated. In the hot press apparatus, a metal die having a convex surface according to a desired embossing shape is mounted on the plate-type heater fixed on the lower press platen, and a metal die having a concave surface that fits with the convex surface is mounted so as to contact the heater fixed at the lower surface of the upper press platen. Then, a resin-made recording medium on which an image has been formed using an ink composition is placed between the upper and lower press platens in such a manner that a filler sheet is interposed between the recording medium, as a support, and the concave metal die. Then, the support and the filler sheet are pressed between the upper and lower press platens by bringing down the upper press platen or the like. The pressure applied in the hot press process is, for example, 30 tons, and the heating temperature of the plate-type heater is, for example, 170° C. The hot pressing is carried out for about 3 minutes while the upper press platen is pressed down to the lower press platen, with the support and filler sheet being pressed between the dies. The support is heated by the heaters through the metal dies, whereby plural convex portions are formed by thermal deformation. Subsequently, cold pressing is carried out in such a manner that, while the support and filler sheet are kept pressed between the metal dies, the support and filler sheet are placed between press platens of an inner water-cooling type, which have no heaters, and pressed under the conditions of, for example, a pressure of 30 tons for about 3 minutes. As a result, the convex shape obtained by the thermal deformation by the hot pressing is maintained on the recording medium, and a molded printed matter which has an image printed on the surface thereof and has undergone embossing is obtained.

The pressure and heating temperature are appropriately changed depending on the materials of the printed matter to be used (recording medium, ink composition), shape to be processed, and the like.

(Vacuum, Pressure Molding, and Vacuum Pressure Molding)

Another examples of the method of forming processing used in the method of producing a processed printed matter of the invention is a vacuum forming. In vacuum forming, a resin-made recording medium on which an image has been formed is pre-heated to a temperature at which the recording medium can be thermally deformed, and is pressed to and cooled with a metal die while being stretched by aspiration under reduced pressure, thereby forming the printed matter into a desired shape. Pressure forming is a method in which a resin-made recording medium on which an image has been formed is pre-heated to a temperature at which the recording medium can be thermally deformed, and is pressed to and cooled with a metal die by pressuring from the opposite side of the metal die. Vacuum pressure forming is a method in which forming is carried out by performing the reducing of the pressure and pressuring at the same time.

For details thereof, reference is made to "Netsu Seikei" described in pp. 766-768 of "Kobunshi Daijiten", Maruzen Co., Ltd. and cited documents therein.

In this manner, a formed resin product, having a surface on which an image is formed, is readily obtained by using a known method of forming processing of resin. Since the ink composition of the invention provides excellent flexibility to the formed image and excellent adhesiveness with a recording medium, the appearance as a printed matter is not impaired even when a formed product is formed using the ink composition; therefore, the ink composition is preferably used in the production method.

As described above, the ink composition of the invention may be used for formation of images of general printed matters, and may also be used in an embodiment in which a recording medium, such as a support, on which an image has been formed is subjected to processing.

These days, printed matters on which forming processing has been subjected, such as decorative sheets, are used in various applications. For example, a membrane switch surface sheet used for electrical appliance or the like is obtained in such a manner that an image is formed on a thin plastic sheet (for example, a PET, polycarbonate, or polystyrene sheet having a thickness of about 100 μm), and then the sheet is subjected to embossing in order to impart a suitable texture to a switch portion (click portion). Moreover, there are many cases in which a printed matter on which an image has been formed is subjected to embossing, in order to obtain a mat printed matter, impart three-dimensional texture to the printed matter, or the like.

Moreover, in widely-distributed automatic vending machines of beverages such as drinking water, tea, or juice, dummies of the actually sold products are displayed. The dummies are produced in such a manner that a flat support obtained by subjecting a transparent thermoplastic resin sheet to decorative printing (i.e., an image is formed) is subjected to deep-draw processing so as to obtain a half in lengthwise of a full-scale beverage case, whereby a formed product (in some cases, with deep-draw molding of 25 mm or more) is produced, which has a configuration enabling strong appeal of the product image thereof when irradiated by light from the back thereof.

The ink used for the printed matter which undergoes the processing is demanded to have properties such that cracking, releasing or the like of the obtained image (printed matter) hardly occurs, and the cured film has excellent impact resistance, excellent flexibility, and excellent adhesiveness with a base material. In this regard, when using a ink composition of the invention, the surface of a film may be efficiently cured since the ink composition of the invention includes a specific compound having a persulfide bond, whereby excellent impact resistance may be attained. Furthermore, the surface hardness (i.e., non-sticky film with a high viscoelasticity) may be attained even when the bulk is a soft film (i.e., a soft film with a low viscoelasticity), so that particularly preferable effects can be exhibited when the ink composition is used in an application in which the processing is carried out after image formation.

Among the processing methods described above, the ink composition is particularly preferably used for vacuum forming.

EXAMPLES

Hereinbelow, the present invention is more specifically described by referring to Examples; however, the present invention is not limited to these examples unless deviated from the gist of the invention. Hereinbelow, "part(s)" is on the mass basis unless otherwise noted.

<Preparation of Pigment Dispersion>

A pigment dispersion (K1) was prepared by mixing the pigment, dispersant, and solvent described below.

Black Pigment Dispersion 1 (K1)

| | |
|---|---|
| Pigment: C.I. Pigment Black 7 | 20 parts |
| Dispersant: polymer dispersant (SOLSPERSE 32000, trade name, manufactured by Zeneca) | 5 parts |
| Solvent: phenoxy ethyl acrylate | 75 parts |

Examples 1 to 15

<Preparation of Ink Composition>

Ink compositions as shown in Table 1 were prepared by mixing the following components.

| Polymerizable compound shown in "Polymerizable compound" column of Table 1 | |
|---|---|
| | Amount as shown in Table 1 |
| Compound having persulfide bond | 2.0 parts |
| Pigment dispersion (K1) | 4.0 parts |
| IRGACURE 819 (photopolymerization initiator) (trade name, photopolymerization initiator manufactured by Ciba Specialty Chemicals, Co., Ltd.) | 8.0 parts |
| Biphenyl benzoyl (photopolymerization initiator) | 4.0 parts |
| IRGACURE 184 (trade name, photopolymerization initiator manufactured by Ciba Specialty Chemicals, Co., Ltd.) | 2.0 parts |
| GENORAD 16 (trade name, manufactured by Rahn, polymerization inhibitor) | 0.1 part |
| BYK-US3500 (trade name; surface segregation polymer, manufactured by BYK Chemie) | 0.4 part |

Details of the polymerizable compounds shown in the "Polymerizable compound" column of Table 1 are described below.

NVC: N-vinyl caprolactam (monofunctional monomer)
PEA: phenoxyethyl acrylate (monofunctional monomer)
SR492: PO-modified trimethylolpropane triacrylate (polymerizable compound) manufactured by Sartomer In Table 1, the numerical values shown in the "NVC", "PEA", and "SR492" columns of the "polymerizable compound" column each indicate mass part(s). The "proportion %" of the "polymerizable compound" column indicates the proportion (mass %) of the monofunctional monomer with respect to the total mass of the radical polymerizable compound.

In Table 1, "a-1" to "a-32" shown in the "Compound having persulfide bond" column are compounds "a-1" to "a-32" described above as the specific examples of the specific compound having a persulfide bond".

[Evaluation]

<Inkjet Image Recording (Printing)>

First, the prepared ink composition was subjected to filtration using a filter having an absolute filtration accuracy of 2 µm.

Subsequently, recording on a recording medium was carried out using a commercially-available inkjet recording apparatus equipped with a piezoelectric inkjet nozzle. The ink supply system was composed of a base tank, a supply pipe, an ink-supply tank from which the ink is supplied to the inkjet head, a filter, and the piezoelectric inkjet head, and the components from the ink-supply tank to the inkjet head were insulated and heated. Thermosensors were provided at the vicinity of the ink-supply tank and the inkjet head nozzle, respectively, and the temperature was controlled so that the temperature at the nozzle portion was constantly at 70° C.±2° C. The piezoelectric inkjet head was allowed to eject the ink composition in such a manner that multi-size dots of 8 pl to 30 pl are formed at a resolution of 720×720 dpi. In the invention, the "dpi" indicates the numbers of dots per 2.54 cm.

The ink composition after the filtration was ejected at an environmental temperature of 25° C. using the inkjet recording apparatus, and then irradiated with ultraviolet ray using UV-LEDs (NCCU033, trade name, manufactured by Nichia Corporation). The LEDs each emit an ultraviolet ray having a wavelength of 365 nm from one chip, and light of about 100 mW is emitted from the chip when a current of about 500 mA is applied thereto. Plural UV-LEDs were arranged at intervals of 7 mm, whereby a power of 0.3 W/cm2 was obtained at the surface of the recording medium. The time interval between the ejection of the ink composition and the subsequent light exposure, and the time period for light exposure can be changed depending on the conveyance speed of the recording medium and the driving directions of the head and LED. In the present Example, the recording medium was subjected to light exposure about 0.2 second after the ejection of the ink composition.

Depending on the distance between the UV-LED and the recording medium, and the conveyance speed of the recording medium, the exposure energy applied to the recording medium can be changed within a range of from 0.01 J/cm$^2$ to 15 J/cm$^2$. The exposure was carried out until sticky texture disappeared from the image surface after the ultraviolet irradiation. A polycarbonate sheet was used as the recording medium.

Under such conditions, the storage stability of the ink composition, the blocking sensitivity of an image (cured film of ink composition) formed using the ink composition, and the presence or absence of odor were evaluated by the methods described below.

Meanwhile, the elongation percentage of the image (cured film of ink composition) formed using the ink composition was changed to the conditions described below and evaluated.

Furthermore, the outgassing of the image (cured film of ink composition) formed using the ink composition was evaluated by the method described below.

(Evaluation of Storage Stability)

The prepared ink composition was stored at 75% RH and 60° C. for 3 days. Then, the ink viscosity at an ejection temperature was measured, and an increment in the ink viscosity was calculated as a viscosity ratio before and after the storage (i.e., viscosity before storage/viscosity after storage). A case in which no viscosity change occurred and the viscosity ratio is nearly 1.0 indicates favorable storage stability, and was evaluated as "A". A case in which the viscosity ratio exceeds 1.5 is evaluated as "C", since clogging may occur at ejection of the ink composition.

(Evaluation of Blocking Sensitivity)

On an image obtained by using the inkjet recording method as described above and subsequent ultraviolet irradiation, 500 PET sheets (size: length and width thereof were the same as those of the polycarbonate sheet on which the image was formed; weight: 2 g/sheet) were stacked. The whole was left stand for 1 day, and then the ink transfer to PET was visually observed. "A" denotes a case in which no transfer is observed, and "C" denotes a case in which transfer occurs. The blocking sensitivity was defined by the exposure energy (mJ/cm$^2$) required until no transfer was observed.

A tolerable range of the blocking sensitivity was 12,000 mJ/cm$^2$ or less, and more preferably 8,000 mJ/cm$^2$ or less.

(Evaluation of Odor)

A 5 cm×5 cm portion was cut out from a polycarbonate sheet on which an image (printed matter) had been formed using the ink composition. The 5 cm-square printed matter was stored in a tightly sealed glass container at 120° C. for 1 week. Then, the glass container was opened, and the volatile components present in the container were checked by smelling.

—Evaluation Criteria—
A: No odor of volatile components is sensed.
B: Faint odor was sensed, but is in a tolerable range.
C: Odor of volatile components is sensed.

(Evaluation of Elongation Percentage)

A cured film of an ink composition was formed in the same manner as in the inkjet recording except that the accumulated exposure amount was changed to 12,000 mJ/cm$^2$ and the illumination intensity was changed to 2140 mW/cm$^2$. The obtained cured film was cut into a portion having a length of 5 cm and a width of 2.5 cm, and stretched at room temperature (20° C.) at a speed of 30 cm/min using a tensile testing machine (AUTOGRAPH AGS-J, trade name, manufactured by Shimadzu Corporation), and the elongation percentage at which the cured film was broken was measured. A status in which the cured film was stretched twice the length as compared from the initial length was defined as an elongation percentage of 100%.

The tolerable range of the elongation percentage required for a case of a roll base material is 100% or more, and the tolerable range of the elongation percentage required for the material to be subjected to forming processing is 200% or more, more preferably 250% or more, and still more preferably 280% or more.

(Evaluation of Outgassing)

A hot plate ("HOT PLATE HP-2L" manufactured by As One Corporation on a pedestal. A glass beaker having an aperture at the top thereof (inner dimension: 31 mm; height: 50 mm) was placed at a position on the hot plate at which the temperature was 100° C., and the top aperture was covered with a transparent acryl plate (DELPET 80N (registered trademark) manufactured by Asahi Kasei Chemicals Corporation, having a size of 40 mm×40 mm and a thickness of 1.8 mm) as a lid. Separately, printing on one surface of a polycarbonate resin sheet having a thickness of 0.5 mm was repeatedly carried out using each of the ink compositions prepared as described above, followed by irradiation with an ultraviolet ray of 600 mJ/cm$^2$ using a metal halide lamp, thereby obtaining a printed sheet having a cured ink layer (thickness: 30 μm) tightly adhered to the resin sheet. The obtained printed sheets were each cut into a round shape, which was then used as test pieces. The size of each test piece was adjusted such that the spatial volume of the beaker was from 50 to 300 when the volume of a test piece was regarded as "1". Each of the test pieces was placed at the bottom of a beaker with the ink layer being directed upward. Then, the beaker was heated so that the bottom of the beaker became 95±15° C., and the top aperture thereof was covered with a transparent acryl plate (DELPET 80N (trademark) manufactured by Asahi Kasei Chemicals Corporation, having a size of 40 mm×40 mm and a thickness of 1.8±0.2 mm) as a lid, and the whole was left stand for 24 hours.

After that, the haze value of the transparent acryl plate was measured. "A" denotes a haze value of 5.0 or less, and "C" denotes a haze value exceeding 5.0.

Comparative Examples 1 to 4

Ink compositions of Comparative Examples 1 to 4 were obtained in substantially the same manner as in Example 1 except that the compound having a persulfide bond used in the preparation of the ink composition of Example 1 was changed to the compounds shown in Table 1, respectively. The comparative ink compositions were evaluated in the same manner as in Example 1.

In the following, Comparative compounds 1 to 3 used in Comparative Examples 2 to 4, respectively, were shown.

Comparative compound 1

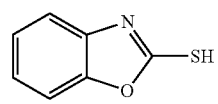

Comparative compound 2

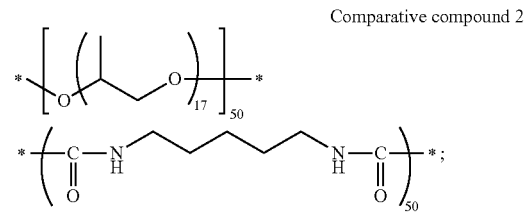

Mw = 15,000

Comparative compound 3

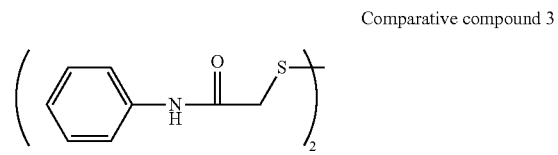

Example

Printed products were produced using, as a recording medium, PANLITE PC-1151 (registered trademark; a polycarbonate sheet having a thickness of 500 μm, manufactured by Teijin Limited.) by substantially the same manner as in the inkjet recording method as described above. Subsequently, the printed matters were each subjected to vacuum forming using a vacuum forming apparatus FORMING 300X (manufactured by Seikosangyo Co., Ltd.). Specifically, the vacuum forming was carried out in such a manner that: a wood die was placed at the center of a vacuum table of the vacuum forming apparatus, and the recording medium was heated to a temperature of from 160 to 180° C.; and then, the vacuum table on which the wood die was placed was slowly brought up by moving a table-lifting lever. The formed products of printed matter were visually observed for the presence or absence of cracks or white spots, and evaluated in accordance with the following criteria. The results are shown in Table 1.

—Evaluation Criteria—
A: Neither crack nor white spot is observed.
C: Cracks or white spots are observed, or the printed matter adhers onto the die.

TABLE 1

| | Pigment dispersion | Polymerizable compound | | | Compound having | | Storage stability | Blocking sensitivity | Outgassing | Odor | Elongation percentage | Formed product of printed matter |
| | | NVC | PEA | SR492 | Proportion % | persulfide bond | | | | | | |
|---|---|---|---|---|---|---|---|---|---|---|---|---|
| Example 1 | K1 | 36.0 | 40.5 | 3.0 | 96.0 | a-1 | A | 8000 | A | B | 280% | A |
| Example 2 | K1 | 36.0 | 40.5 | 3.0 | 96.0 | a-2 | A | 8000 | A | B | 280% | A |
| Example 3 | K1 | 36.0 | 40.5 | 3.0 | 96.0 | a-4 | A | 8000 | A | B | 280% | A |
| Example 4 | K1 | 36.0 | 40.5 | 3.0 | 96.0 | a-6 | A | 8000 | A | B | 280% | A |
| Example 5 | K1 | 36.0 | 40.5 | 3.0 | 96.0 | a-7 | A | 8000 | A | A | 280% | A |
| Example 6 | K1 | 36.0 | 40.5 | 3.0 | 96.0 | a-8 | A | 8000 | A | B | 280% | A |
| Example 7 | K1 | 36.0 | 40.5 | 3.0 | 96.0 | a-14 | A | 8000 | A | B | 280% | A |
| Example 8 | K1 | 36.0 | 40.5 | 3.0 | 96.0 | a-16 | A | 8000 | A | B | 280% | A |
| Example 9 | K1 | 36.0 | 40.5 | 3.0 | 96.0 | a-23 | A | 8000 | A | B | 280% | A |
| Example 10 | K1 | 36.0 | 40.5 | 3.0 | 96.0 | a-24 | A | 6000 | A | A | 280% | A |
| Example 11 | K1 | 36.0 | 40.5 | 3.0 | 96.0 | a-26 | A | 6000 | A | A | 280% | A |
| Example 12 | K1 | 36.0 | 40.5 | 3.0 | 96.0 | a-29 | A | 6000 | A | A | 280% | A |
| Example 13 | K1 | 36.0 | 40.5 | 3.0 | 96.0 | a-30 | A | 10000 | A | A | 290% | A |
| Example 14 | K1 | 36.0 | 40.5 | 3.0 | 96.0 | a-31 | A | 5000 | A | A | 250% | A |
| Example 15 | K1 | 36.0 | 40.5 | 3.0 | 96.0 | a-32 | A | 5000 | A | A | 280% | A |
| Comparative Example 1 | K1 | 36.0 | 40.5 | 3.0 | 96.0 | None | A | 8000 | C | B | 240% | C |
| Comparative Example 2 | K1 | 36.0 | 40.5 | 3.0 | 96.0 | Comparative compound 1 | C | 15000 | A | C | 260% | A |
| Comparative Example 3 | K1 | 36.0 | 40.5 | 3.0 | 96.0 | Comparative compound 2 | A | 8000 | C | A | 220% | C |
| Comparative Example 4 | K1 | 36.0 | 40.5 | 3.0 | 96.0 | Comparative compound 3 | A | 8000 | C | A | 240% | C |

As is apparent from Table 1, the ink compositions of Examples had superior storage stability and was able to form highly-flexible ink films having higher blocking sensitivity and higher stretch property, as compared to the ink compositions of Comparative Examples. Moreover, outgassing was suppressed when the ink compositions of Examples were used. Furthermore, the formed products of printed matter of Examples did not suffer from generation of cracks or white spots, and therefore, it was found that the ink compositions of the invention were able to be preferably used in an embodiment in which a printed matter on which an image has been formed is subjected to forming processing.

According to the invention, an ink composition is provided which can be cured at high sensitivity when irradiated with a radiation, and which can form an image having excellent flexibility.

According to the invention, a method of producing a formed product of printed matter is provided, in which a printed matter with excellent processing suitability, which is obtained by ejecting the ink composition by an inkjet method and curing the ejected ink composition, is used.

Exemplary embodiments of the present invention include the following embodiments. However, the present invention is not limited to the following exemplary embodiments.

<1> An active radiation curable ink composition comprising:

a compound having a persulfide bond, at least one end of the persulfide bond being bonded to a ring structure directly or via a carbonyl group or a thiocarbonyl group;

at least one radical polymerizable compound; and a photopolymerization initiator.

<2> The active radiation curable ink composition according to <1>, wherein the compound having a persulfide bond, at least one end of the persulfide bond being bonded to a ring structure directly or via a carbonyl group or a thiocarbonyl group, is represented by the following Formula (I) or Formula (II):

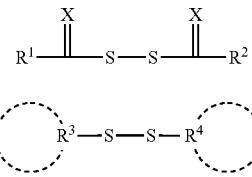

wherein, in Formula (I), each X independently represents an oxygen atom or a sulfur atom; and $R^1$ and $R^2$ each independently represents a straight-chain, branched or cyclic alkyl group having 1 to 20 carbon atoms which may have a substituent and may include a hetero atom, or an aromatic ring group which may have a substituent and may include a hetero atom, wherein at least one of $R^1$ and $R^2$ represents a ring structure; and in Formula (II), $R^3$ and $R^4$ each independently represents an aromatic ring group which may have a substituent and may include a hetero atom, wherein when the aromatic ring group has plural substituents, the substituents may be bonded with each other to form a three-membered or higher-membered ring structure.

<3> The active radiation curable ink composition according to <1>, wherein the compound having a persulfide bond, at least one end of the persulfide bond being bonded to a ring structure directly or via a carbonyl group or a thiocarbonyl group, is a polymer compound having a weight average molecular weight of from 3,000 to 100,000 which has, in a side chain thereof, a partial structure represented by the following Formula (III) or Formula (IV):

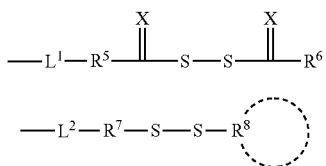

wherein, in Formula (III), $L^1$ represents a divalent linking group; $R^5$ represents a straight-chain, branched or cyclic alkylene group having 1 to 20 carbon atoms which may have a substituent and may include a hetero atom, or an aromatic ring group which may have a substituent and may include a hetero atom; and $R^6$ represents a straight-chain, branched or cyclic alkyl group having 1 to 20 carbon atoms which may have a substituent and may include a hetero atom, or an aromatic ring group which may have a substituent and may include a hetero atom, wherein at least one of $R^5$ and $R^6$ represents a ring structure; and in Formula (IV), $L^2$ represents a divalent linking group; $R^7$ represents a straight-chain, branched or cyclic alkylene group having 1 to 20 carbon atoms which may have a substituent and may include a hetero atom, or an aromatic ring group which may have a substituent and may include a hetero atom; and $R^8$ represents an aromatic ring group which may have a substituent and may include a hetero atom, wherein when the aromatic ring group has plural substituents, the substituents may be bonded with each other to form a 3-membered or higher-membered cyclic structure.

<4> The active radiation curable ink composition according to <1>, wherein the compound having a persulfide bond, at least one end of the persulfide bond being bonded to a ring structure directly or via a carbonyl group or a thiocarbonyl group, is a polymer compound having a weight average molecular weight of from 3,000 to 100,000 which has, in the main chain, a partial structure represented by the following formula (V) or (VI):

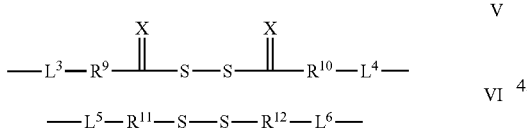

wherein in Formula (V), $L^3$ and $L^4$ each independently represents a divalent linking group; and $R^9$ and $R^{10}$ each independently represents a divalent aromatic ring group which may have a substituent and may include a hetero atom, or an alicyclic alkylene group which may have a substituent and may include a hetero atom; and in Formula (VI), $L^5$ and $L^6$ each independently represents a divalent linking group; and $R^{11}$ and $R^{12}$ each independently represents a divalent aromatic ring group which may have a substituent and may include a hetero atom, or an alicyclic alkylene group which may have a substituent and may include a hetero atom.

<5> The active radiation curable ink composition according to any one of <1> to <4>, wherein the ring structure of the compound having a persulfide bond, at least one end of the persulfide bond being bonded to a ring structure directly or via a carbonyl group or a thiocarbonyl group, is an aromatic ring group which may have a substituent and may include a hetero atom.

<6> The active radiation curable ink composition according to any one of <1> to <5>, further comprising a polymerization inhibitor.

<7> The active radiation curable ink composition according to any one of <1> to <6>, wherein the at least one radical polymerizable compound includes at least one monofunctional monomer in an amount of from 85% by mass to 100% by mass with respect to a total mass of the at least one radical polymerizable compound.

<8> The active radiation curable ink composition according to any one of <1> to <7>, wherein the at least one radical polymerizable compound includes at least one monofunctional monomer selected from the group consisting of an amine group-containing monomer, N-vinyl caprolactam (NVC), tetrahydrofurfuryl acrylate (THFA), isobornyl acrylate (IBOA) and phenoxyethyl acrylate (PEA).

<9> A method of producing a processed product of printed matter, the method comprising:

ejecting the active radiation curable ink composition according to any one of <1> to <8> by an inkjet method onto a recording medium formed from a formable resin material to form an image;

irradiating the obtained image with active radiation to cure the ink composition, thereby obtaining a printed matter having a cured image on the recording medium; and subjecting the printed matter to at least one processing selected from the group consisting of forming processing and punching processing.

<10> The method of producing a processed product of printed matter according to <9> wherein the printed matter is subjected to vacuum forming.

All publications, patent applications, and technical standards mentioned in this specification were herein incorporated by reference to the same extent as if each individual publication, patent application, or technical standard was specifically and individually indicated to be incorporated by reference.

What is claimed is:

1. An active radiation curable ink composition comprising:
a compound having a persulfide bond, at least one end of the persulfide bond being bonded to a ring structure directly or via a carbonyl group or a thiocarbonyl group;
at least one radical polymerizable compound; and
a photopolymerization initiator; wherein
the at least one radical polymerizable compound includes at least one monofunctional monomer in an amount of from 85% by mass to 100% by mass with respect to a total mass of the at least one radical polymerizable compound.

2. The active radiation curable ink composition according to claim 1, wherein the compound having a persulfide bond, at least one end of the persulfide bond being bonded to a ring structure directly or via a carbonyl group or a thiocarbonyl group, is represented by the following Formula (I) or Formula (II):

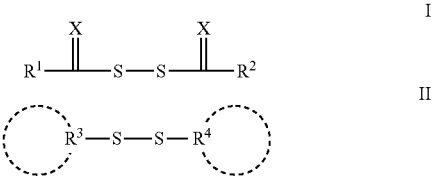

wherein, in Formula (I), each X independently represents an oxygen atom or a sulfur atom; and $R^1$ and $R^2$ each independently represents a straight-chain, branched or cyclic alkyl group having 1 to 20 carbon atoms which may have a substituent and may include a hetero atom, or an aromatic ring group which may have a substituent and may include a hetero atom, wherein at least one of $R^1$ and $R^2$ represents a ring structure; and in Formula (II), $R^3$ and $R^4$ each independently represents an aromatic ring group which may have a substituent and may include a hetero atom, wherein when the aromatic ring group has plural substituents, the substituents may be bonded with each other to form a three-membered or higher-membered ring structure.

3. The active radiation curable ink composition according to claim 1, wherein the compound having a persulfide bond, at least one end of the persulfide bond being bonded to a ring structure directly or via a carbonyl group or a thiocarbonyl group, is a polymer compound having a weight average molecular weight of from 3,000 to 100,000 which has, in a side chain thereof, a partial structure represented by the following Formula (III) or Formula (IV):

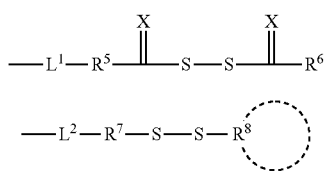

wherein, in Formula (III), $L^1$ represents a divalent linking group; $R^5$ represents a straight-chain, branched or cyclic alkylene group having 1 to 20 carbon atoms which may have a substituent and may include a hetero atom, or an aromatic ring group which may have a substituent and may include a hetero atom; and $R^6$ represents a straight-chain, branched or cyclic alkyl group having 1 to 20 carbon atoms which may have a substituent and may include a hetero atom, or an aromatic ring group which may have a substituent and may include a hetero atom, wherein at least one of $R^5$ and $R^6$ represents a ring structure; and in Formula (IV), $L^2$ represents a divalent linking group; $R^7$ represents a straight-chain, branched or cyclic alkylene group having 1 to 20 carbon atoms which may have a substituent and may include a hetero atom, or an aromatic ring group which may have a substituent and may include a hetero atom; and $R^8$ represents an aromatic ring group which may have a substituent and may include a hetero atom, wherein when the aromatic ring group has plural substituents, the substituents may be bonded with each other to form a 3-membered or higher-membered cyclic structure.

4. The active radiation curable ink composition according to claim 1, wherein the compound having a persulfide bond, at least one end of the persulfide bond being bonded to a ring structure directly or via a carbonyl group or a thiocarbonyl group, is a polymer compound having a weight average molecular weight of from 3,000 to 100,000 which has, in the main chain, a partial structure represented by the following formula (V) or (VI):

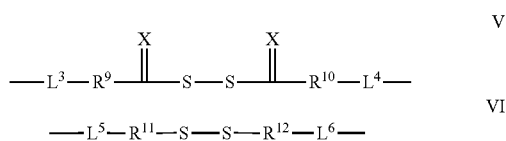

wherein, in Formula (V), $L^3$ and $L^4$ each independently represents a divalent linking group; and $R^9$ and $R^{10}$ each independently represents a divalent aromatic ring group which may have a substituent and may include a hetero atom, or an alicyclic alkylene group which may have a substituent and may include a hetero atom; and in Formula (VI), $L^5$ and $L^6$ each independently represents a divalent linking group; and $R^{11}$ and $R^{12}$ each independently represents a divalent aromatic ring group which may have a substituent and may include a hetero atom, or an alicyclic alkylene group which may have a substituent and may include a hetero atom.

5. The active radiation curable ink composition according to claim 1, wherein the ring structure of the compound having a persulfide bond, at least one end of the persulfide bond being bonded to a ring structure directly or via a carbonyl group or a thiocarbonyl group, is an aromatic ring group which may have a substituent and may include a hetero atom.

6. The active radiation curable ink composition according to claim 1, further comprising a polymerization inhibitor.

7. The active radiation curable ink composition according to claim 1, wherein the at least one radical polymerizable compound includes at least one monofunctional monomer selected from the group consisting of an amine group-containing monomer, N-vinyl caprolactam (NVC), tetrahydrofurfuryl acrylate (THFA), isobornyl acrylate (IBOA) and phenoxyethyl acrylate (PEA).

8. A method of producing a processed product of printed matter, the method comprising:
    ejecting the active radiation curable ink composition according to claim 1, by an inkjet method, onto a recording medium formed from a formable resin material to form an image;
    irradiating the obtained image with active radiation to cure the ink composition, thereby obtaining a printed matter having a cured image on the recording medium; and
    subjecting the printed matter to at least one processing selected from the group consisting of forming processing and punching processing.

9. The method of producing a processed product of printed matter according to claim 8, wherein the printed matter is subjected to vacuum forming.

* * * * *